United States Patent
Dimmler et al.

(10) Patent No.: US 6,825,517 B2
(45) Date of Patent: Nov. 30, 2004

(54) FERROELECTRIC TRANSISTOR WITH ENHANCED DATA RETENTION

(75) Inventors: Klaus Dimmler, Colorado Springs, CO (US); Alfred P. Gnadinger, Colorado Springs, CO (US)

(73) Assignee: COVA Technologies, Inc., Colorado Springs, CO (US)

( * ) Notice: Subject to any disclaimer, the term of this patent is extended or adjusted under 35 U.S.C. 154(b) by 17 days.

(21) Appl. No.: 10/229,890

(22) Filed: Aug. 28, 2002

(65) Prior Publication Data

US 2004/0041180 A1 Mar. 4, 2004

(51) Int. Cl.$^7$ .............................................. H01L 29/76
(52) U.S. Cl. ........................ 257/295; 257/296; 257/310; 257/314; 257/315; 257/352; 257/363
(58) Field of Search ................................ 257/295, 296, 257/310, 314, 315, 352, 368

(56) References Cited

U.S. PATENT DOCUMENTS

| | | |
|---|---|---|
| 5,046,043 A | 9/1991 | Miller et al. |
| 5,227,855 A | 7/1993 | Momose |
| 5,365,094 A | 11/1994 | Takasu |
| 5,384,729 A | 1/1995 | Sameshima |
| 5,434,811 A | 7/1995 | Evans, Jr. et al. |
| 5,479,317 A | 12/1995 | Ramesh |
| 5,519,235 A | 5/1996 | Ramesh |
| 5,523,964 A | 6/1996 | McMillan et al. |
| 5,536,672 A | 7/1996 | Miller et al. |
| 5,559,733 A | 9/1996 | McMillan et al. |
| 5,736,759 A | 4/1998 | Haushalter |
| 5,739,563 A | 4/1998 | Kawakubo et al. |
| 5,757,042 A * | 5/1998 | Evans et al. ............... 257/295 |
| 5,780,886 A | 7/1998 | Yamanobe et al. |
| 5,789,775 A | 8/1998 | Evans, Jr. et al. |
| 5,808,676 A | 9/1998 | Biegelsen et al. |
| 5,825,317 A | 10/1998 | Anderson et al. |
| 5,858,533 A | 1/1999 | Greuter et al. |
| 5,872,739 A | 2/1999 | Womack |
| 5,886,920 A | 3/1999 | Marshall et al. |

(List continued on next page.)

FOREIGN PATENT DOCUMENTS

| | | |
|---|---|---|
| JP | 408055919 A | 2/1996 |
| WO | WO98/98/13300 | 2/1998 |

OTHER PUBLICATIONS

Tokumitsu, Eisuke et al, "Characterization of MF(M)IS structures using P(L)ZT and $Y_2O_3$ films", Jpn. J. of Appl. Phys., vol. 39, Sep. 2000, pp. 5456–5459.

(List continued on next page.)

*Primary Examiner*—Huan Hoang
*Assistant Examiner*—Mai-Huong Tran
(74) *Attorney, Agent, or Firm*—Peter J. Meza; William J. Kubida; Hogan & Hartson LLP

(57) ABSTRACT

Data retention of a ferroelectric transistor is extended by intecting holes or electrons into the ferroelectric transistor when power is removed. The ferroelectric FET has a mechanism to trap charge in a buffer dielectric layer or in the ferroelectric layer sandwiched between a top electrode and a silicon substrate. The state of polarization is detected before power is removed from the ferroelectric FET. Charge is injected into the ferroelectric FET to produce a first threshold voltage when a first polarization state is determined before power is removed. Charge is removed from the ferroelectric FET to produce a second threshold voltage when a second polarization state is determined before power is removed. When the ferroelectric FET is powered up again, the state of charge injected is determined. The ferroelectric FET is then polarized to correspond to a first threshold voltage when the charge state corresponding to the first threshold is determined. The ferroelectric FET is polarized to correspond to a second threshold voltage when a charge state corresponding to the second threshold is determined.

22 Claims, 21 Drawing Sheets

U.S. PATENT DOCUMENTS

| | | | |
|---|---|---|---|
| 5,887,117 | A | 3/1999 | Desu et al. |
| 5,919,515 | A | 7/1999 | Yano et al. |
| 5,953,061 | A | 9/1999 | Biegelsen et al. |
| 5,955,213 | A | 9/1999 | Yano et al. |
| 5,959,879 | A | 9/1999 | Koo |
| 5,977,577 | A | 11/1999 | Evans, Jr. |
| 6,025,735 | A | 2/2000 | Gardner et al. |
| 6,027,947 | A | 2/2000 | Evans et al. |
| 6,031,754 | A | 2/2000 | Derbenwick et al. |
| 6,066,868 | A | 5/2000 | Evans, Jr. |
| 6,104,049 | A | 8/2000 | Solayappan et al. |
| 6,121,648 | A | 9/2000 | Evans, Jr. |
| 6,130,103 | A | 10/2000 | Cuchiaro et al. |
| 6,140,672 | A | 10/2000 | Arita et al. |
| 6,147,895 | A | 11/2000 | Kamp |
| 6,150,184 | A | 11/2000 | Evans et al. |
| 6,151,242 | A | 11/2000 | Takashima |
| 6,165,802 | A | 12/2000 | Cuchiaro et al. |
| 6,171,934 | B1 | 1/2001 | Joshi et al. |
| 6,194,751 | B1 | 2/2001 | Evans, Jr. |
| 6,201,731 | B1 | 3/2001 | Kamp et al. |
| 6,207,465 | B1 | 3/2001 | Cuchiaro et al. |
| 6,225,156 | B1 | 5/2001 | Cuchiaro et al. |
| 6,225,656 | B1 | 5/2001 | Cuchiaro et al. |
| 6,245,451 | B1 * | 6/2001 | Kamisawa et al. ......... 428/697 |
| 6,245,580 | B1 | 6/2001 | Solayappan et al. |
| 6,255,121 | B1 | 7/2001 | Arita et al. |
| 6,256,220 | B1 | 7/2001 | Kamp |
| 6,307,225 | B1 | 10/2001 | Kijima et al. |
| 6,319,542 | B1 | 11/2001 | Summerfelt et al. |
| 6,322,849 | B2 | 11/2001 | Joshi et al. |
| 6,326,315 | B1 | 12/2001 | Uchiyama et al. |
| 6,358,758 | B2 | 3/2002 | Arita et al. |
| 6,362,068 | B1 | 3/2002 | Summerfelt et al. |
| 6,365,927 | B1 | 4/2002 | Cuchiaro et al. |
| 6,370,056 | B1 | 4/2002 | Chen et al. |
| 6,372,518 | B1 | 4/2002 | Nasu et al. |
| 6,373,743 | B1 | 4/2002 | Chen et al. |
| 6,396,093 | B1 | 5/2002 | Nakamura |
| 6,396,095 | B1 * | 5/2002 | Shimada et al. ............ 257/295 |
| 6,469,334 | B2 | 10/2002 | Arita et al. |
| 6,623,985 | B1 | 9/2003 | Igarashi |
| 2002/0083959 | A1 | 7/2002 | Morita et al. |

OTHER PUBLICATIONS

Tokumitsu, Eisuke et al, "Preparation of STN films by the sol–gel method for ferroelectric gate structures", IMF–10 Madrid/Spain (2001), pp. 105–110.

Tokumitsu, Eisuke et al, "Electrical Properties of MFIS and MFMIS FETs using ferroelectric SBT film and STO/SiON buffer layer", Jpn. J. of Appl.Phys., vol. 39, Apr. 2000, pp. 2125–2130.

Shin, Chang Ho et al, "Fabrication and characterization of MFIS FET using $Al_2O_3$ insulating layer for nonvolatile memory", ISIF 2001, 9 pages.

Lee, Ho Nyung et al., "CV characteristics of $Pt/SBT/CeO_2/Si$ structure for non volatile memory devices", ISIF, 4 pages.

Choi, Hoon Sang et al, "Crystal Structure and electrical properties of $Pt/SBT/ZrO_2/Si$", J. of Korean Phys. Soc., vol. 39, No. 1, Jul. 2001, pp. 179–183.

Li, W.P. et al, "Improvement of MFS structures without buffer layers between Si and ferroelectric film", Applied Physics A, Springer (2000), pp. 85–87.

Han, Jin–Ping et al, "Memory effects of SBT capacitors on silicon with silicon nitride buffer", Integrated Ferroelectrics, 1998, vol. 22, pp. 213–221.

Miller, S.L. and McWhorter, P.J., "Device Physics of the ferroelectric memory field effect transistor", ISIF Jun. 1992, pp. 5999–6010.

Kalkur, T.S., "Characteristics of MFS capacitors and MFS-FETs with $BaMgF_4$ gate dielectrics", ISIF 1992, 1 page.

Wu, S.Y., IEEE Trans.Electron Devices ED 21, 499 (1974). An excellent review article referencing the same work was published in 1992 by Sinharoy, S. et al, "Integration of ferroelectric thin films into nonvolatile memories", J. Vac. Sci. Technol.A 10(4), Jul./Aug. 1992, pp. 1554–1561.

Chung, Ilsub et al., "Data Retention: Fabrication and characterization of MFISFET using CMOS process for single transistor memory applications", Integrated Ferroelectrics, 1999, vol. 27, pp. 31–39.

Miller, S.L. and McWhorter, P.J., "Theoretical investigation of a ferroelectric transistor: Physics of the ferroelectric nonvolatile memory field effect transistor", J. Appl.Phys. 72 (12), Sep. 9, 1992, pp. 5999–6010.

Smyth, D.M., "Charge Motion in ferroelectric thin films", Ferroelectrics, vol. 116, pp. 117–124 (1991), pp. 117–124.

Wu, S.Y. "A ferroelectric memory device, Metal–Ferroelectric–Semiconductor Transistor", IEEE Trans.Electron Devices, vol. ED–21, No. 8, Aug. 1994, pp. 499–504.

Moshnayaga, V. et. al., "Preparation of rare–earth manganite–oxide thin films by metalorganic aerosol deposition technique", Appl. Phys. Lett., vol. 74, No. 19, pp 2842–2844 (1998).

Kim, Kwang–Ho, "Metal–Ferroelectric—Semiconductor (MFS) FET's using LiNbO3/Si (100) Structures for nonvolatile memory applications", IEEE Electron Device Letters, vol. 19, No. 6, pp. 204–206 (Jun. 1998).

* cited by examiner

FERROELECTRIC TRANSISTOR WITH ENHANCED DATA RETENTION

FIELD OF THE INVENTION

The invention disclosed relates generally to ferroelectric transistors, and more particularly to a method for extending the data retention of ferroelectric transistors.

BACKGROUND OF THE INVENTION

Ferroelectric transistors are structurally identical to metal-oxide-silicon field effect transistor (MOSFET) devices with the gate oxide layer replaced by a ferroelectric material layer 12, as shown in FIG. 1. The polarization state of the ferroelectric material layer 12 gives rise to an electric field, which shifts the turn-on threshold voltage of the device 10. Transistors known in the prior art often include a non-ferroelectric dielectric layer 16 between the ferroelectric material and the silicon substrate 18, as shown in the device 14 of FIG. 2. This dielectric layer 16 generally has several purposes at the silicon/ferroelectric interface including avoidance of uncontrolled growth of silicon dioxide, avoidance of high electric fields at the interface, separating the ferroelectric materials from the silicon, avoidance of crystal lattice structure mismatch between the silicon and the ferroelectric materials, and keeping hydrogen away from the ferroelectric materials. Such a dielectric layer 16 is sometimes also placed between the top electrode layer 20 and the ferroelectric layer 12 for the same reasons. These devices, such as devices 10 and 14 and variants thereof, are utilized in arrays of rows and columns to form one-transistor ("1T") non-volatile ferroelectric memories.

When a voltage greater than a coercive voltage is applied across the ferroelectric material, the ferroelectric material polarizes in the direction aligning with the electric field. When the applied voltage is removed, the polarization state is preserved. When a voltage greater than the coercive voltage is applied to the ferroelectric material in the opposite direction, the polarization in the ferroelectric material reverses. When that electric field is removed, the reversed polarization state remains in the material. The electric field generated by the polarization offsets the natural tun-on threshold of the transistors, effectively shifting the turn-on thresholds of the transistors. By applying known voltages less than the coercive voltage on the terminals of the transistor, the state of the polarization within the ferroelectric material can be detected without altering the stored polarization states, a method known in the prior art as non-destructive read-out.

Though exhibiting many favorable properties such as small feature size, good endurance, and low read and write operating voltages, conventional ferroelectric transistors are known in the prior art to have poor retention time. The electric field generated by the polarization is reduced due to a number of factors including a depolarization field that reverses the polarization over time and compensation by impurities within the ferroelectric material. As the electric field is compensated, the threshold of the device shift is reduced until the sensing circuits can no longer detect the stored polarization state. The ferroelectric transistor has thereby lost the stored logic state.

Another type of non-volatile memory known in the prior art operates by injecting holes or electrons into a thin film, thereby shifting the turn-on threshold negatively or positively. Such memories include flash and non-volatile memories based on silicon nitride thin films. Electrons or holes are injected into a thin film by applying a voltage significantly larger than the read operating voltage. Such memories are known to exhibit excellent retention characteristics, but have marginal endurance properties, slow write times, and high power consumption during write cycles. What is desired, therefore, is a non-volatile ferroelectric device that exhibits the desirable retention characteristics of a flash memory but without the undesirable properties of low endurance, slow write times, and high power consumption.

SUMMARY OF THE INVENTION

According to principles of the present invention, a novel apparatus and method extends data retention of a ferroelectric transistor exhibiting hysteresis by injecting holes or electrons into the ferroelectric transistor when power is removed. The ferroelectric FET has a mechanism to trap charge in a buffer dielectric layer or in the ferroelectric layer sandwiched between a top electrode and the silicon substrate. The state of polarization is detected before power is removed from the ferroelectric FET. Charge is injected into the ferroelectric FET to produce a first threshold voltage when a first polarization state is determined before power is removed. Charge is removed from the ferroelectric FET to produce a second threshold voltage when a second polarization state is determined before power is removed. When the ferroelectric FET is powered up again, the charge state is determined. The ferroelectric FET is then polarized to correspond to a first threshold voltage when the charge state corresponding to the first threshold is determined. The ferroelectric FET is polarized to correspond to a second threshold voltage when a charge state corresponding to the second threshold is determined. Charge mechanisms include tunneling mechanisms. Fowler Nordheim tunneling, avalanche breakdown, hot carrier injection, and impact ionization. In one embodiment, charge is injected only into the drain region of the ferroelectric FET, the FET being operated so that injected charge is determined by passing current through the ferroelectric FET with source and drain reversed, a high current representing a first charge state corresponding to a first threshold and a lower current representing a second charge state corresponding to a second threshold. In another embodiment, a sense amplifier is utilized that can operate around a first operating point and a second operating point induced by the injected charge, while differentiating a first polarization state and a second polarization state around first operating point and second operating point.

The foregoing and other objects, features and advantages of the invention will become more readily apparent from the following detailed description of a preferred embodiment of the invention, which proceeds with reference to the accompanying drawings.

DETAILED DESCRIPTION OF THE INVENTION

The present invention discloses a ferroelectric transistor exhibiting hysteresis wherein the data retention properties are extended by injecting charge into the device when it is powered down.

Figure 3:
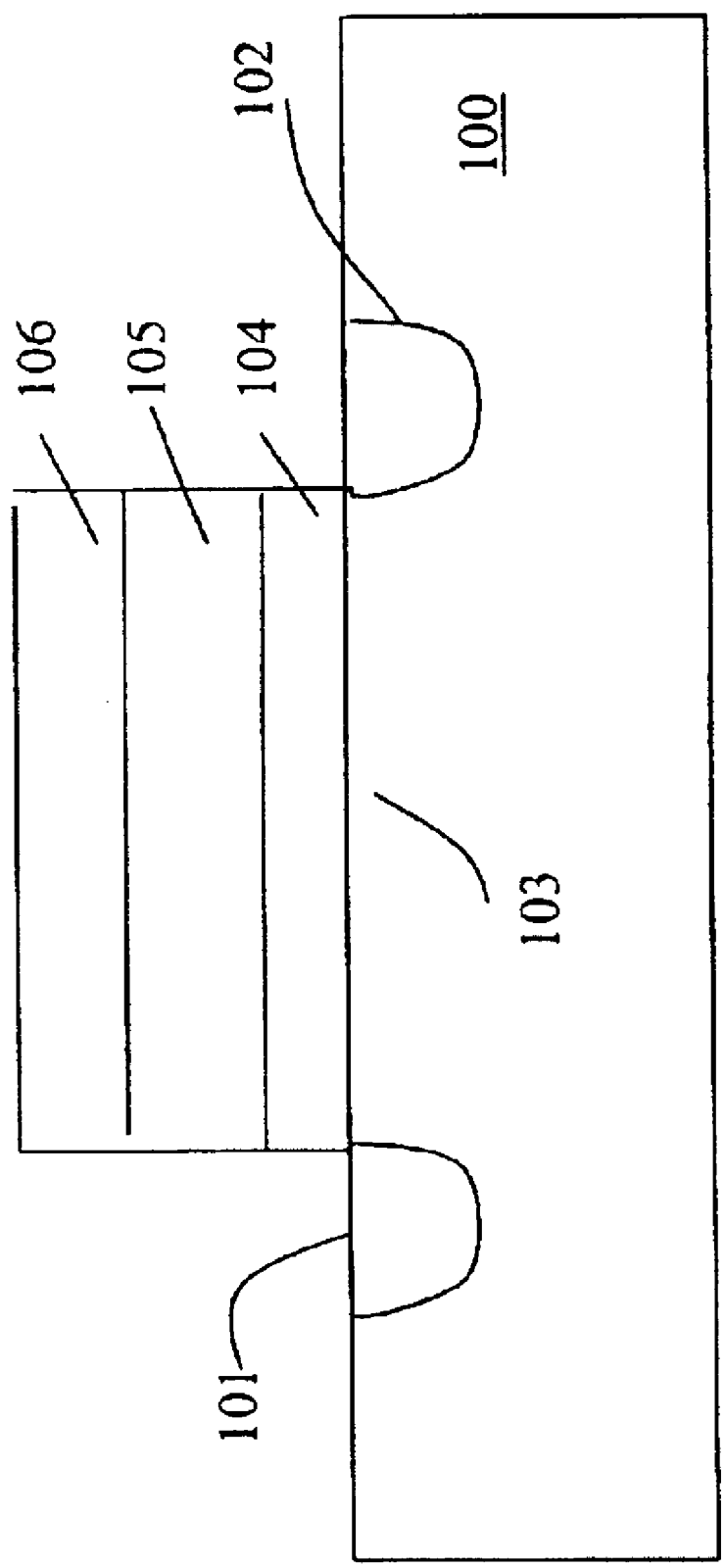
FIG. 3 is a cross sectional view illustrating the structure of a ferroelectric FET according to one embodiment of the present invention.

FIG. 3 is a cross sectional view illustrating the structure of a ferroelectric FET according to one embodiment of the present invention. In one embodiment, n-type silicon regions 101 and 102 are formed within P-type silicon substrate 100, the region between them disposing the channel region 103. A dielectric buffer layer 104 is formed on the channel region 103. Ferroelectric layer 105 is formed on dielectric buffer layer 104, and gate electrode layer 106 is formed on top of dielectric layer 105. The ferroelectric material is comprised of any material exhibiting ferroelectric hysteresis, preferably one with a relatively low dielectric constant (epsilon of 80 or less) so that a relatively large component of a voltage applied across the structure consisting of ferroelectric layer 105 and dielectric layer 104 falls across the ferroelectric layer 105. One such class of ferroelectric materials are materials of the general formula $A_xMn_yO_z$ where x, y, z vary from 0.1 to 10 and A is a rare earth element selected from a group consisting of CE, Pr, Nd, Pm, Sm, Eu, GD, Tb, Dy, Ho, Er, Tm, Yb, Lu, Y or Sc. The ferroelectric material can be formed utilizing any one of a variety of methods including spin-on gel, sputtering, and MOCVD. The gate electrode layer is comprised of any conductive material, including metal and doped polysilicon. The dielectric layer can be any non-conductive material including silicon dioxide, silicon nitride, magnesium oxide, and aluminum oxide, formed utilizing any one of a variety of methods including oxidation, sputtering. ALD (Atomic Layer Deposition), and MOCVD (Metal Oxide Chemical Vapor Deposition). In one embodiment, the dielectric layer and the ferroelectric layer are formed in the same equipment in a single session as not to expose underlying layers directly to the atmosphere. The terminals of the ferroelectric transistor of FIG. 3 are source 101, drain 102, electrode 106, and body 100.

Figure 4:
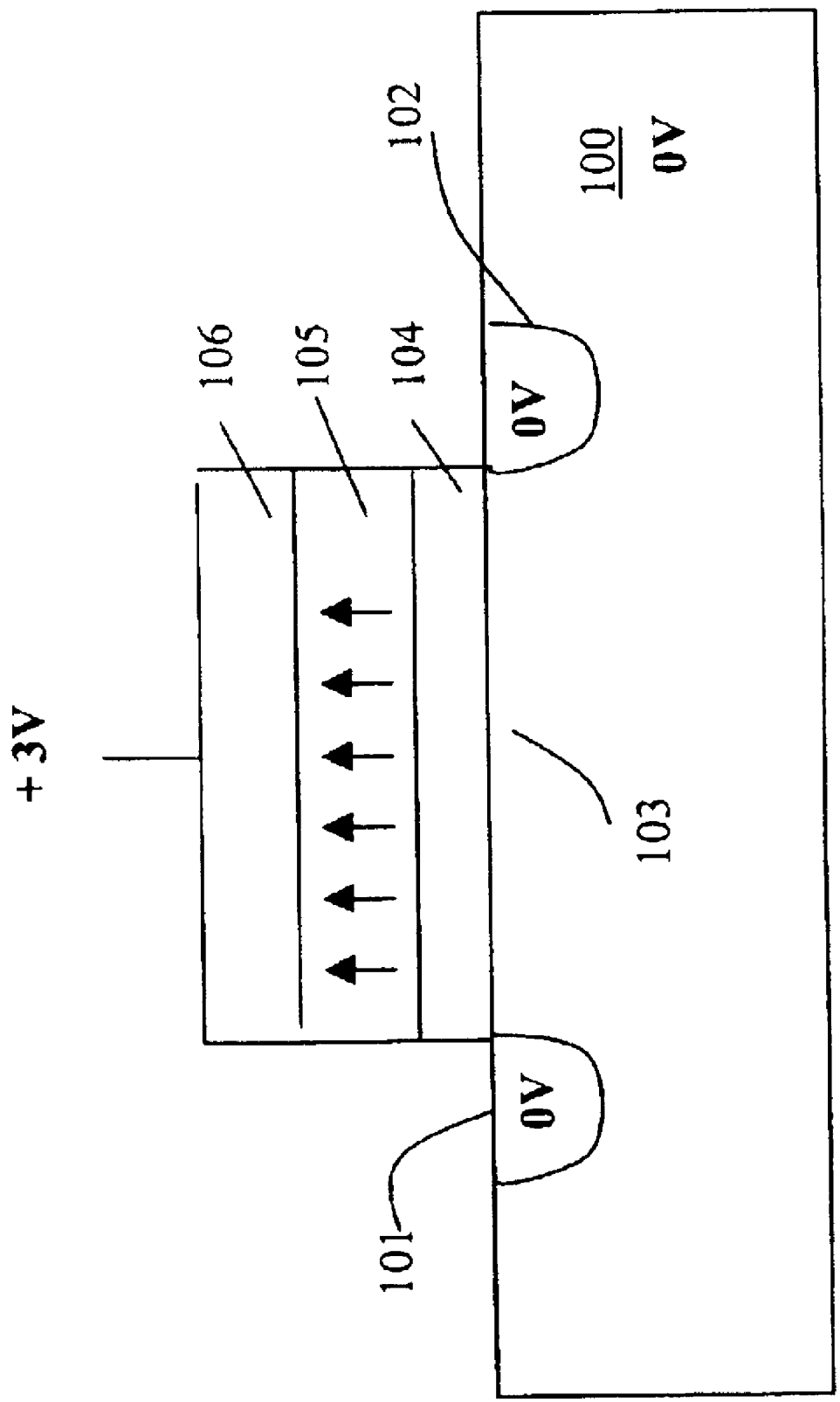
FIG. 4 is a cross sectional diagram illustrating the applied voltages on the terminals in order to polarize the ferroelectric material in the "low ferro state".

FIG. 4 illustrates an example of the applied voltages on the terminals of the ferroelectric FET in order to polarize the ferroelectric material in one state, herein referred to as the "low ferro state". If the voltage across ferroelectric layer 105 is greater than the coercive voltage, the voltage on gate electrode layer 106 is positive with respect to channel region 103. In the illustration of FIG. 4. +3V is applied to gate electrode layer 106, and ground potential is applied to source 101, drain 102, and body 100. Channel region 103 is at ground potential, thereby applying +3V across buffer layer 104 and ferroelectric layer 105. It is assumed in this example that the dielectric constant and the thickness of buffer layer 104 and ferroelectric layer 105 are such as to produce at least a coercive voltage across ferroelectric layer 105. The polarization aligns with the electric field, having the effect of decreasing the natural turn-on threshold of the ferroelectric device. Assuming that the natural turn-on threshold of the ferroelectric device is Vt1, the threshold voltage after polarizing to this low ferro state will be Vt10, Vt1 minus the threshold shift created by the polarization.

Figure 5:
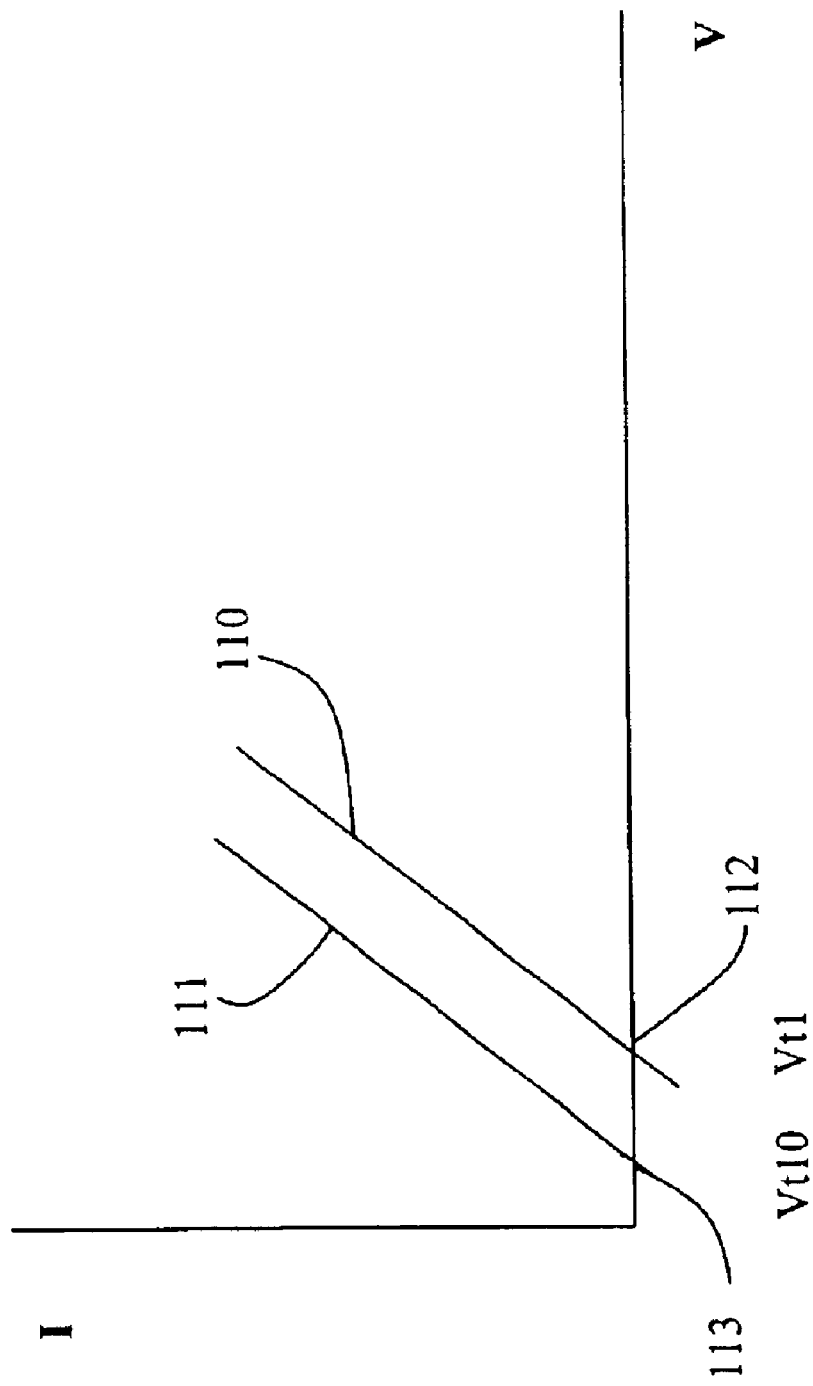
FIG. 5 is a plot of current versus voltage in the linear transistor region of the ferroelectric transistor illustrating the effects of the threshold shift created by polarizing the ferroelectric layer to the low ferro state.

FIG. 5 is a plot of the current versus voltage (I–V) characteristics in the linear transistor region of the ferroelectric transistor illustrating the effects of the threshold shift created by polarizing the ferroelectric layer to the low ferro state. Line 110 represents the I–V characteristics of the ferroelectric transistor before polarization. The threshold voltage Vt1 is determined by the intersection of line 110 with the current defined as the turn-on current (112). When the ferroelectric layer stores that low ferro state, the I–V characteristics are shifted negatively along the voltage axis, resulting in line 111. Threshold voltage Vt10 corresponding to the low ferro state polarization is determined by the intersection of line 111 with the line representing the defined turn-on current (113).

Figure 6:
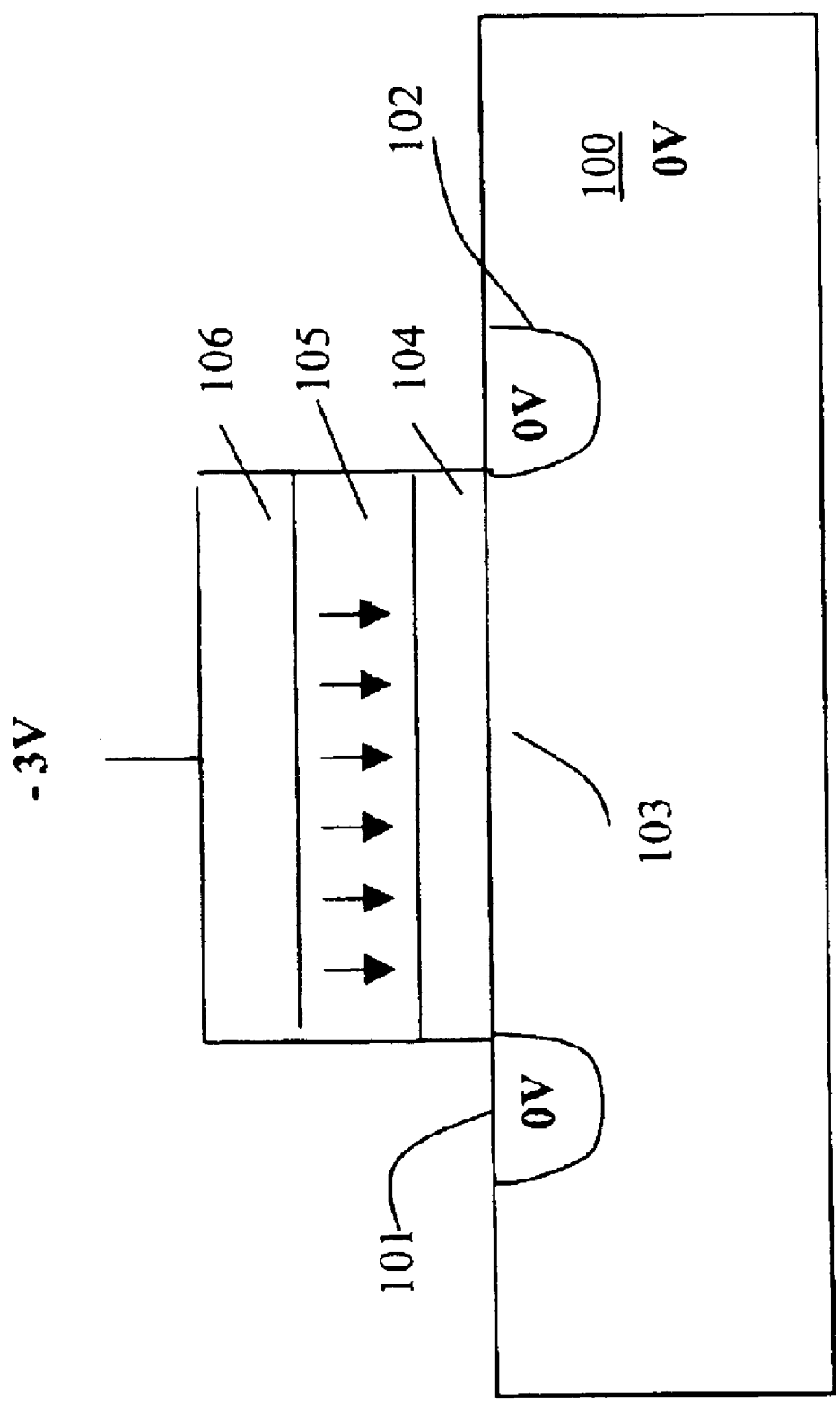
FIG. 6 illustrates the applied voltages on the terminals in order to polarize the ferroelectric material in the "high ferro state".

FIG. 6 illustrates an example of the applied voltages on the device terminals in order to polarize the ferroelectric material to a second state, herein referred to as the "high ferro state". If the voltage across ferroelectric layer 105 is greater than the coercive voltage, the voltage on gate electrode layer 106 is negative with respect to channel region 103. In the illustration of FIG. 6, −3V is applied to gate electrode layer 106, and ground potential is applied to source 101, drain 102, and body 100. Channel region 103 is at ground potential, thereby applying −3V between across buffer layer 104 and ferroelectric layer 105. It is assumed in this example that the dielectric constant and the thickness of buffer layer 104 and ferroelectric layer 105 are such as to produce at least a coercive voltage across ferroelectric layer 105. The polarization aligns with the electric field, having the effect of increasing the natural turn-on threshold of the ferroelectric device. Assuming that the natural turn-on threshold of the ferroelectric device is Vt1, the threshold voltage after polarizing to this high ferro state will be Vt11, Vt1 plus the threshold shift created by the polarization.

Figure 7:
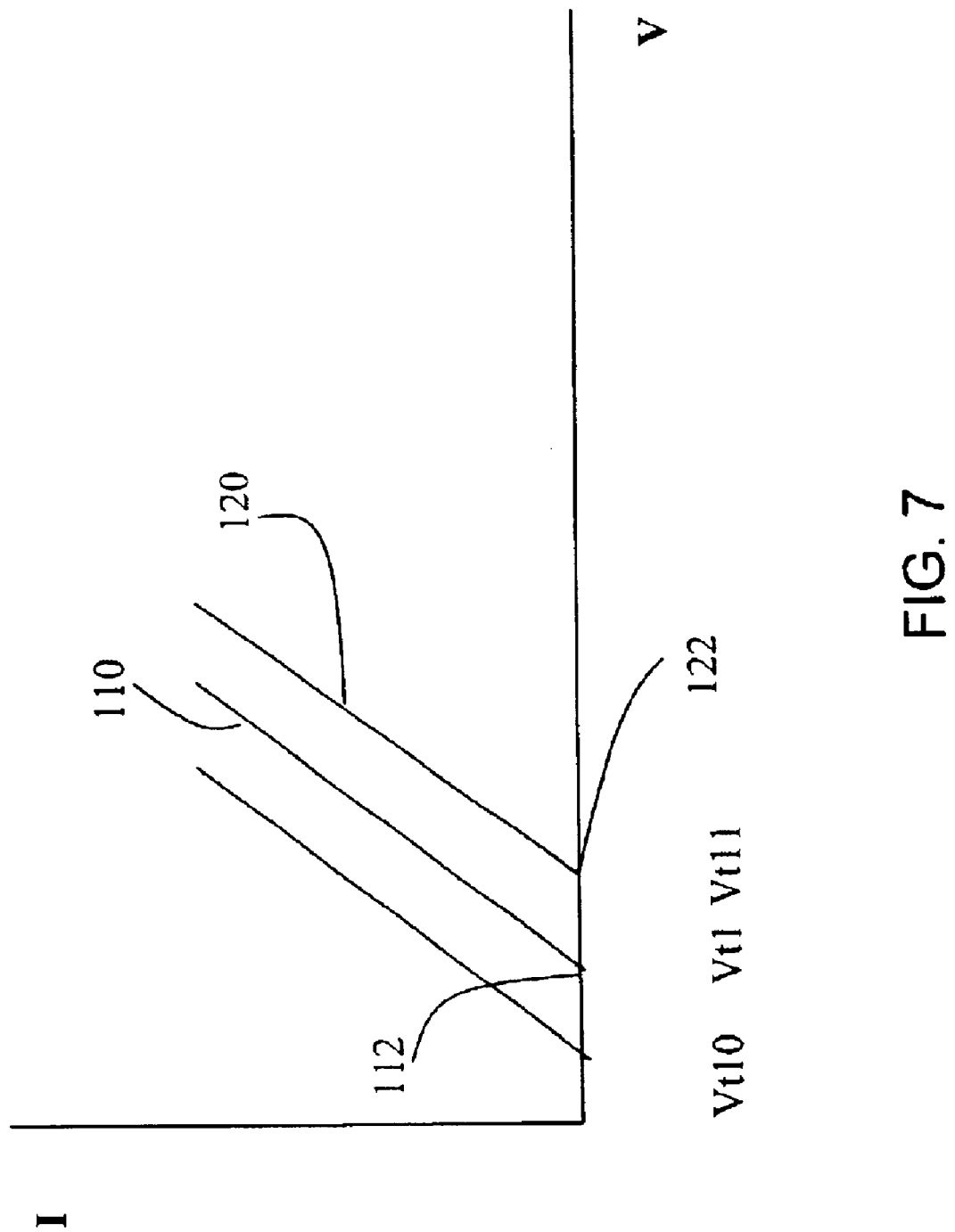
FIG. 7 is a plot of current versus voltage in the linear transistor region of the ferroelectric transistor illustrating the effects of the threshold shift created by polarizing the ferroelectric layer to the high ferro state.

FIG. 7 is a plot of the I–V characteristics in the linear transistor region of the ferroelectric transistor illustrating the effects of the threshold shift created by polarizing the ferroelectric layer to the high ferro state. Line 110 represents the I–V characteristics of the ferroelectric transistor before polarization. The threshold voltage Vt1 is determined by the intersection of line 110 with the current defined as the turn-on current (112). When the ferroelectric layer stores that high ferro state, the I–V characteristics are shifted positively along the voltage axis, resulting in line 120. Threshold voltage Vt11 corresponding to the high ferro state polarization is determined by the intersection of line 120 with the line representing the defined turn-on current (122).

Before power is removed from the ferroelectric transistor, the stored polarization in the ferroelectric layer is sensed. If the Vt10 corresponding to the low ferro state is detected, no further action is applied to the transistor. If the Vt11 threshold is detected, then electron charge is injected into the buffer dielectric layer.

Figure 8:
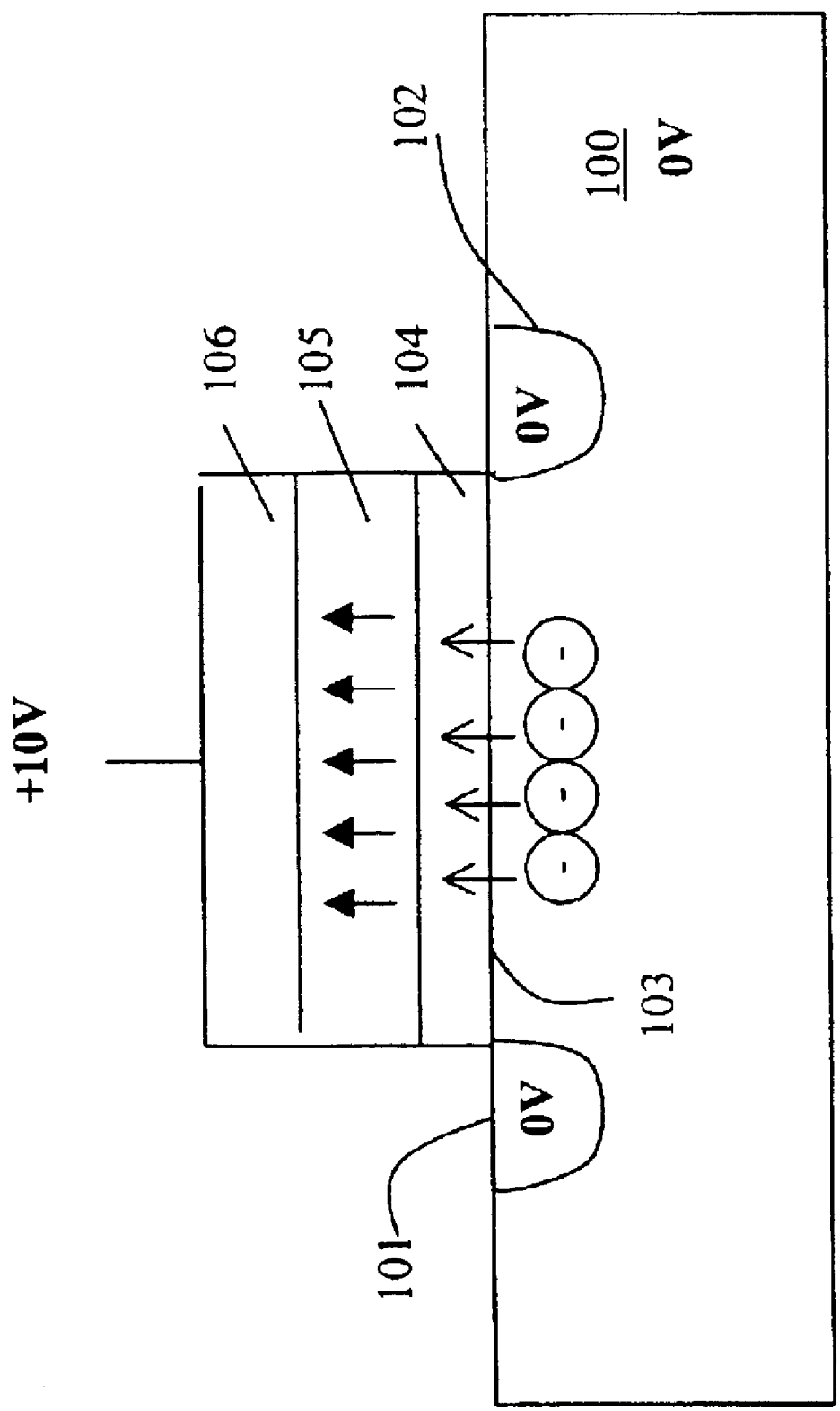
FIG. 8 is a cross sectional diagram of a ferroelectric transistor illustrating one voltage bias scheme that will inject electrons into the dielectric buffer layer.

FIG. 8 is a cross sectional diagram of a ferroelectric transistor illustrating one voltage bias scheme that injects electrons into the dielectric buffer layer 104. In this example, +10V is applied on gate electrode 106, ground on source 101, drain 102, and body 100. The high positive electric field generated between gate electrode 106 and channel 103 attracts electrons in the channel region 103, and injects them into dielectric buffer layer 104. When the high electric field is removed, the electron charge remains in buffer layer 104. The negative charge within the buffer layer 104 shifts the turn-on threshold of the device positively. This electric field also polarizes the ferroelectric to a low ferro state.

In a variation of this embodiment, impact ionization may be used to inject electrons into the buffer layer 104 by additionally applying a voltage differential between source 101 and drain 102.

In another variation of this embodiment, the dielectric buffer layer 104 is sufficiently thin to inject some or all of the electron charge into the ferroelectric layer 105.

In another variation of this embodiment, the dielectric buffer layer 104 consists of multiple layers.

Figure 1:
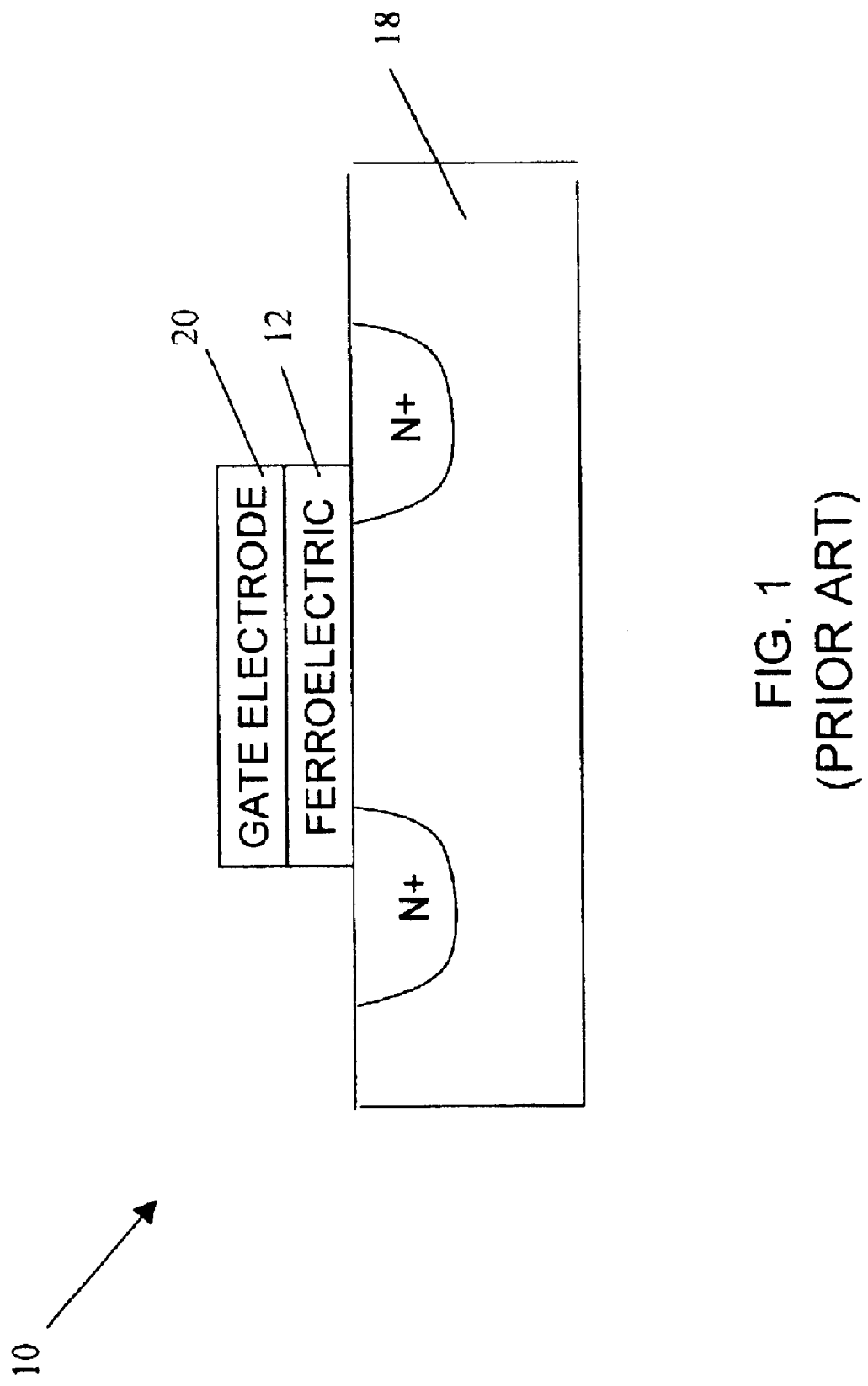
FIG. 1 is a cross sectional diagram of a ferroelectric FET as known in the prior art.
Figure 2:
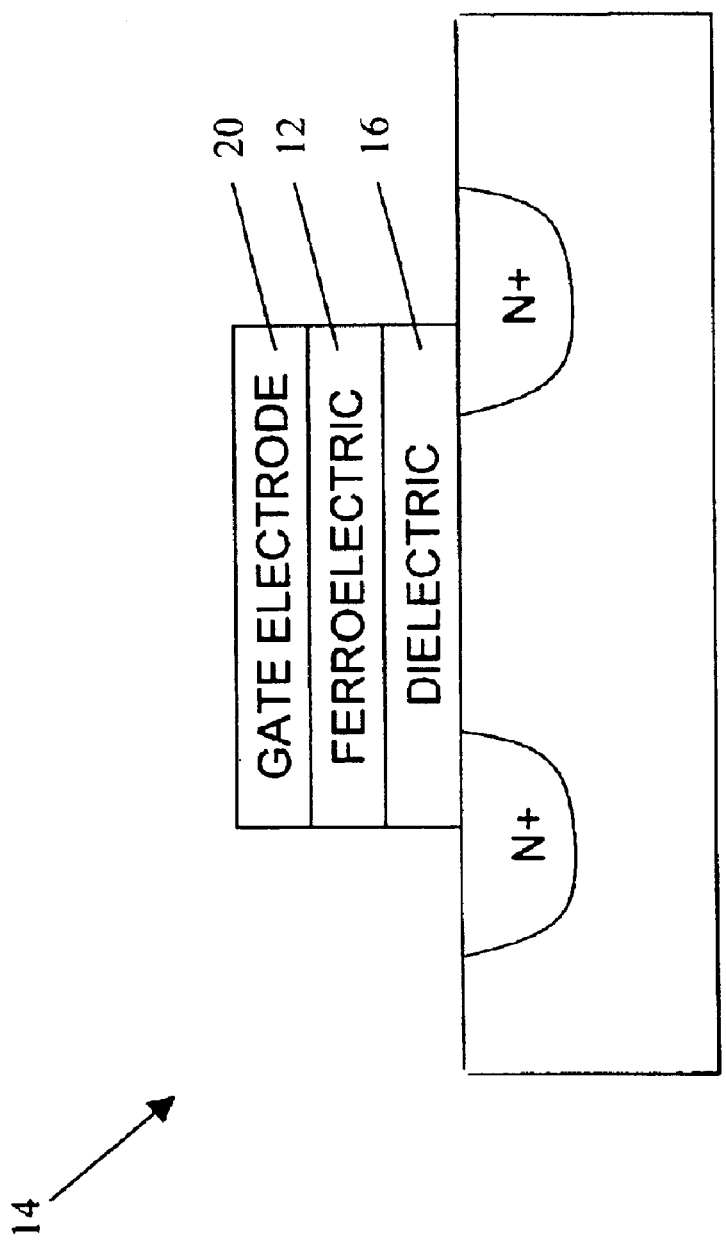
FIG. 2 is a cross sectional diagram of a ferroelectric FET with a dielectric buffer layer as known in the prior art.
Figure 9:
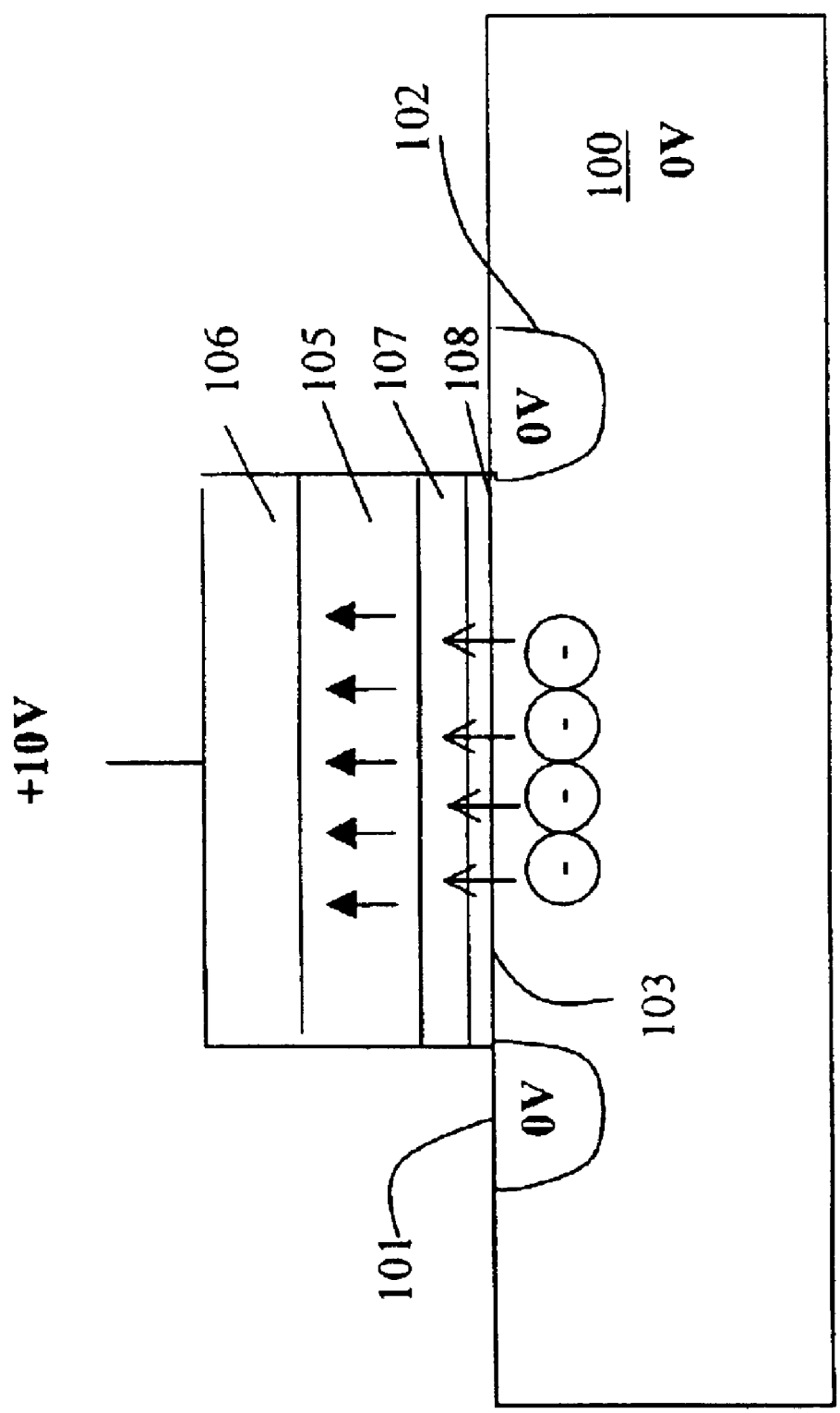
FIG. 9 is a cross sectional diagram of a ferroelectric transistor illustrating one voltage bias scheme that tunnels electrons into a silicon nitride layer through a thin silicon dioxide layer.

FIG. 9 illustrates another variation of this embodiment wherein dielectric layer 104 consists of a silicon dioxide layer 108 and a silicon nitride layer 107, the silicon dioxide layer being sufficiently thin for tunneling and the silicon nitride layer being sufficiently thick not to inject negative charge out of the silicon nitride layer. In another variation of this embodiment, the transistor structure does not have a dielectric buffer layer 104. In this case, the ferroelectric layer 105 is formed directly on the channel region as shown in the prior art transistor of FIG. 1. In this embodiment, electrons are injected directly into ferroelectric layer 105.

In another variation of this embodiment, a dielectric buffer layer 104 is not deliberately formed, but forms nonetheless as a result of other processing steps imposed on the ferroelectric FET. For example, a thin layer of silicon dioxide 104 may be formed on the silicon/ferroelectric layer interface due to thermal steps while exposing the silicon surface to an oxidizing agent.

Figure 10:
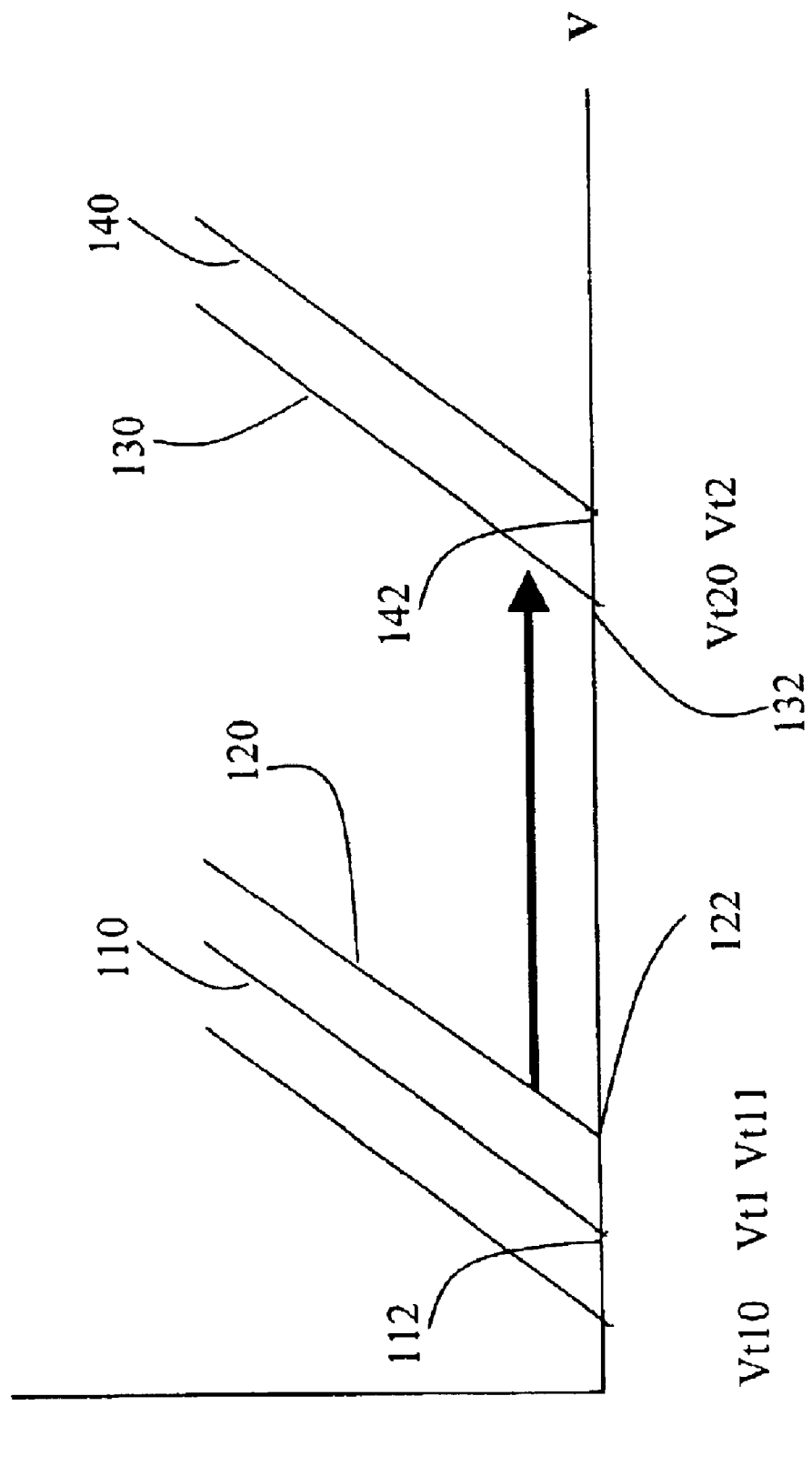
FIG. 10 is a graph illustrating the effect on the threshold of the ferroelectric transistor when a large positive voltage is applied between the gate electrode and the channel.

FIG. 10 is a graph illustrating the effect on the threshold of the ferroelectric transistor when a large positive voltage is applied between the gate electrode and the channel. Vt2 represents the threshold after the electrons are injected into the film above the channel region if the ferroelectric layer were not polarized. The positive voltage across the ferroelectric layer causes the material to polarize in the direction of the electric field, corresponding to a low ferro state. This state reduces the threshold voltage to Vt20, which is Vt2 minus the threshold shift of the low ferro state (132). It is assumed in this embodiment that the threshold shift brought about due to negative charge injection is sufficiently large not to overlap the thresholds of a high ferro state/low charge state and a low ferro state/high charge. Stated mathematically this is: Vt20 is greater than Vt11.

The component of threshold shift resulting from the electron injection has a significantly longer retention time than the ferroelectric polarization. In this way, the charge injection mechanism is utilized to significantly extend the data retention time of the ferroelectric transistor. When the ferroelectric transistor is powered up again, the electron charge is removed from the buffer dielectric or the ferroelectric layer of ferroelectric transistor, as the case may be, by applying appropriate voltage biases.

Figure 11:
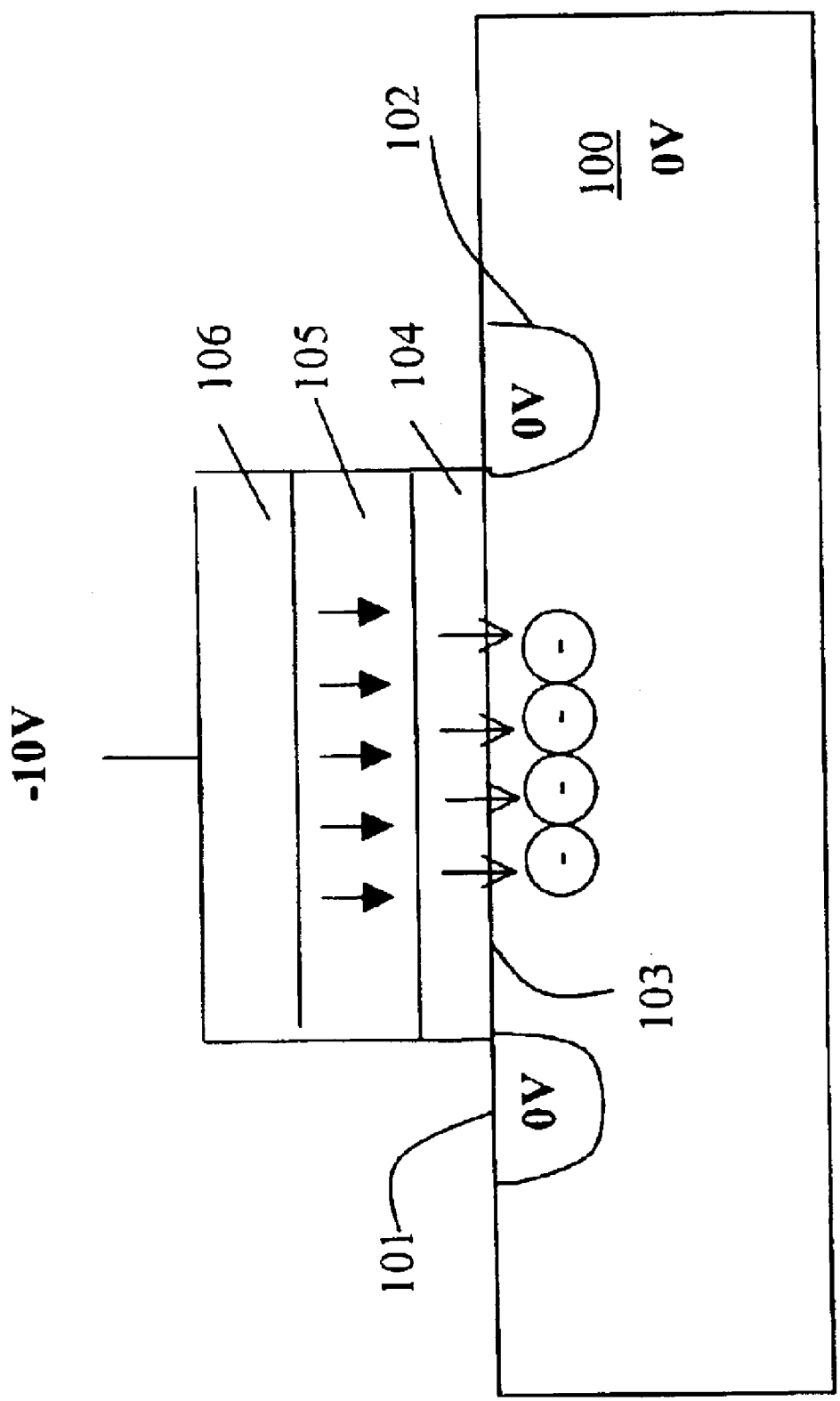
FIG. 11 is a cross sectional diagram illustrating the applied voltages to inject negative charge into the dielectric buffer layer.
Figure 12:
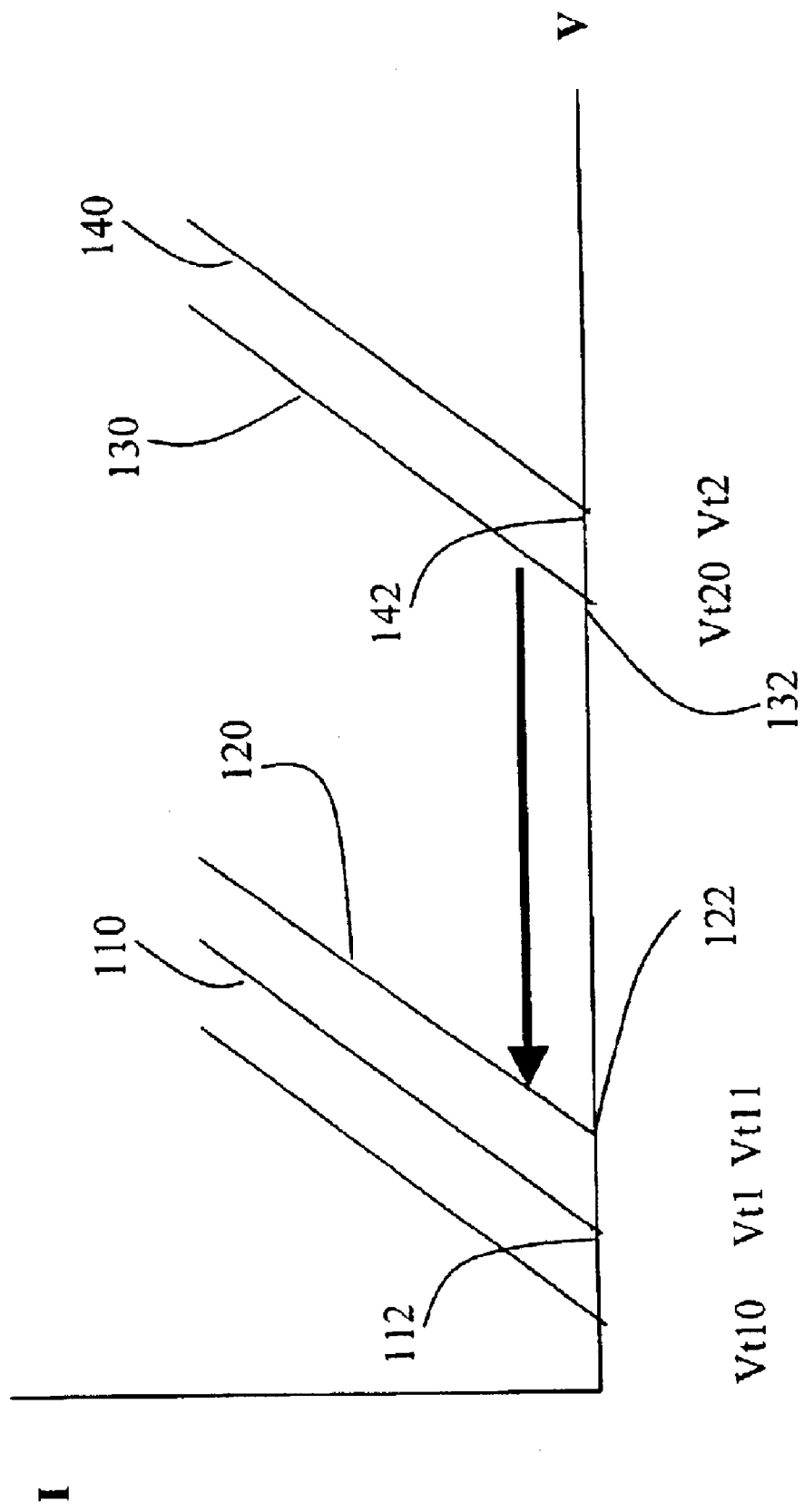
FIG. 12 is a graph illustrating the threshold shift when a large negative voltage is applied between gate electrode and channel region.

Accordingly, when the ferroelectric transistor is powered up and the Vt20 threshold voltage is detected, a large negative charge is applied between gate electrode 106 and channel 103, as illustrated in the cross sectional diagram of FIG. 11. This electric field forces the electrons out of the buffer dielectric 104, and serves to shift the threshold from Vt2 towards Vt1, as shown in FIG. 12. This mechanism may equivalently be viewed as injecting holes. Since the polarization of the ferroelectric material aligns with the electric field, a high ferro polarization state is written into the ferroelectric layer 105. Adding the effects of the electron charges and the polarization of the ferroelectric layer 105, the threshold voltage is Vt11, thereby restoring the voltage to its original value before the power down occurred.

Figure 13:
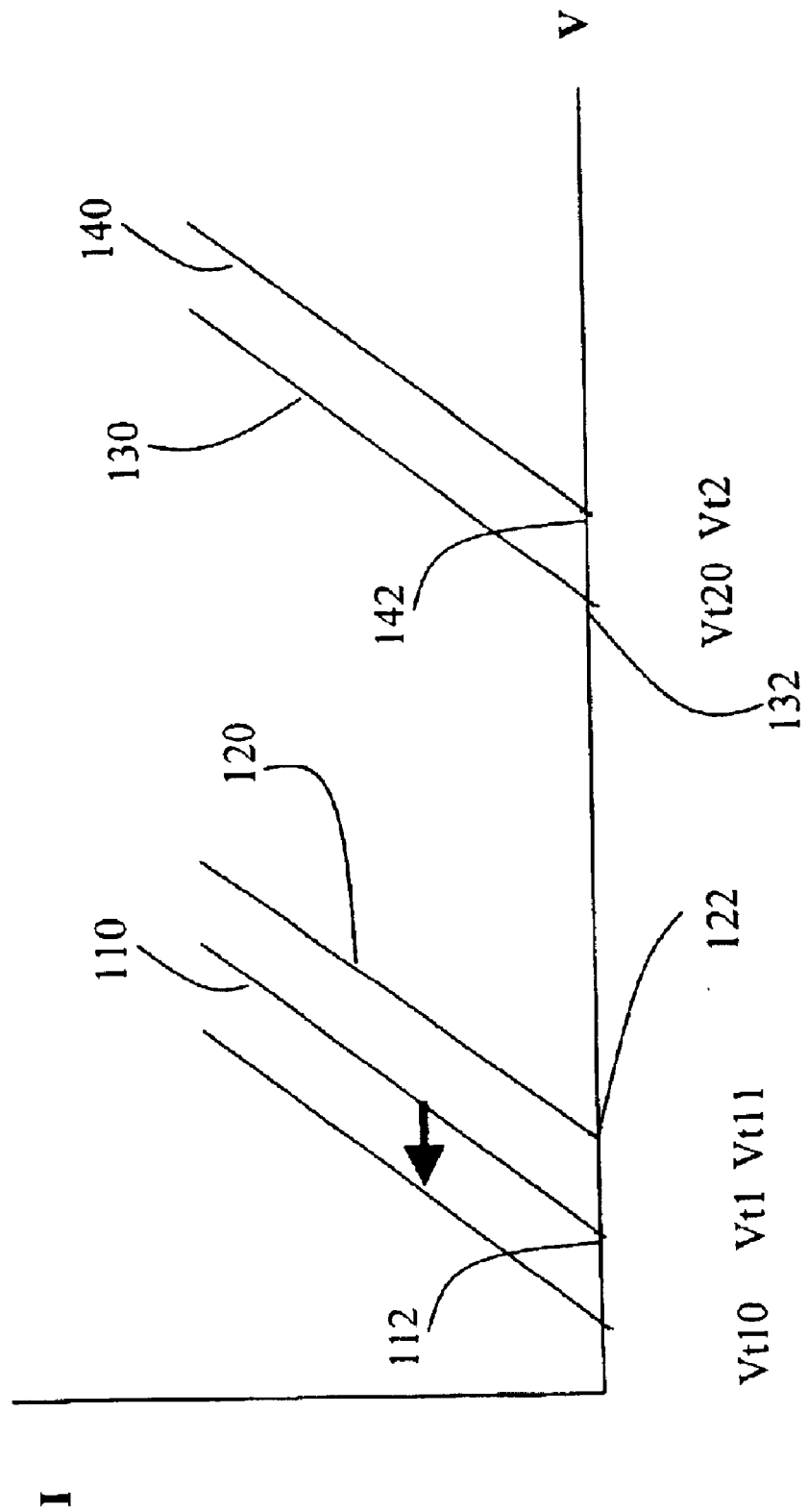
FIG. 13 is a graph illustrating the shift of the ferroelectric FET when refreshing the low ferro state upon power up.

If Vt20 is not detected when the ferroelectric transistor is powered up, then Vt10 was stored in the ferroelectric transistor before it was powered down. Since the retention time of the ferroelectric polarization is known to be a weakness in this transistor structure, it is possible that the threshold may have drifted toward Vt1. Therefore, in one embodiment of this invention, voltages are applied to the ferroclectric transistor to refresh the low ferro state by returning the threshold voltage to Vt10. This shift is illustrated in the plot of FIG. 13.

Figure 14:
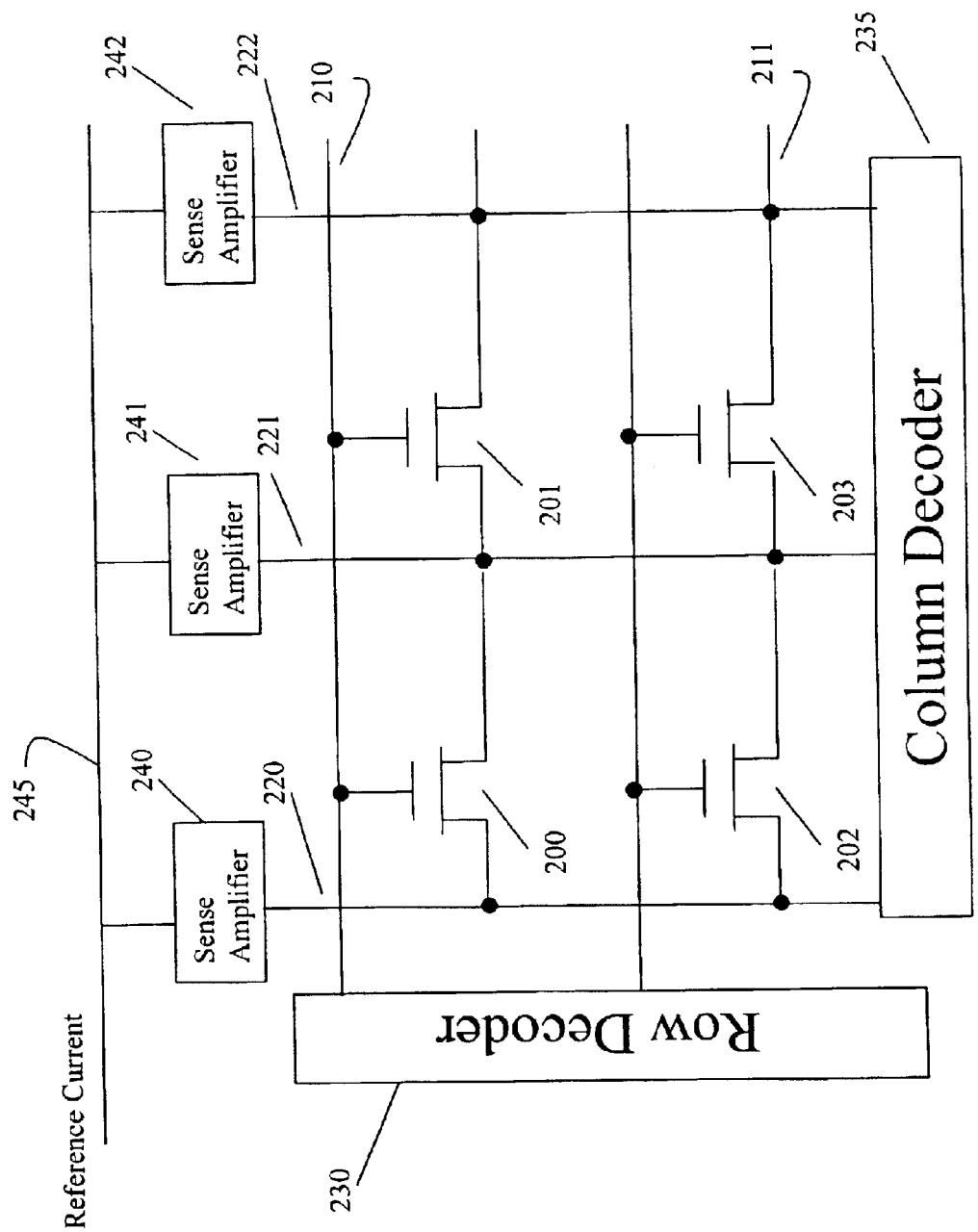
FIG. 14 is a schematic diagram illustrating one method of configuring the ferroelectric FETs in a memory array.

FIG. 14 illustrates one embodiment wherein the transistors are configured in a memory array of rows and columns. The gate terminal of transistors in a common row share a common word line. For example, devices 200 and 201 share word line 210, and devices 202 and 203 share word line 211. The sources and drains of transistors in a common column share common bit lines. For example, the sources of transistors 200 and 202 share bit line 220, while drains share a common bit line 221. In this embodiment, bit line 221 also connects the sources of adjacent transistors 201 and 203. Drains of transistors 201 and 203 share common bit line 222. A given word line is selected by a row decoder 230. One of more bit lines are selected by column decoder 235. A sense amplifier is connected to each bit line (sense amplifier 240 to bit line 220, sense amplifier 241 to bit line 221, and sense amplifier 242 to bit line 222), and compares the respective bit line current to reference current 245. The reference current provides a current of magnitude between the magnitude of currents produced on the respective bit lines when reading high state and the low state on the selected transistor, thereby causing the sense amplifier flip in one direction or the other depending on the state stored in the selected ferroelectric cell.

Figure 15:
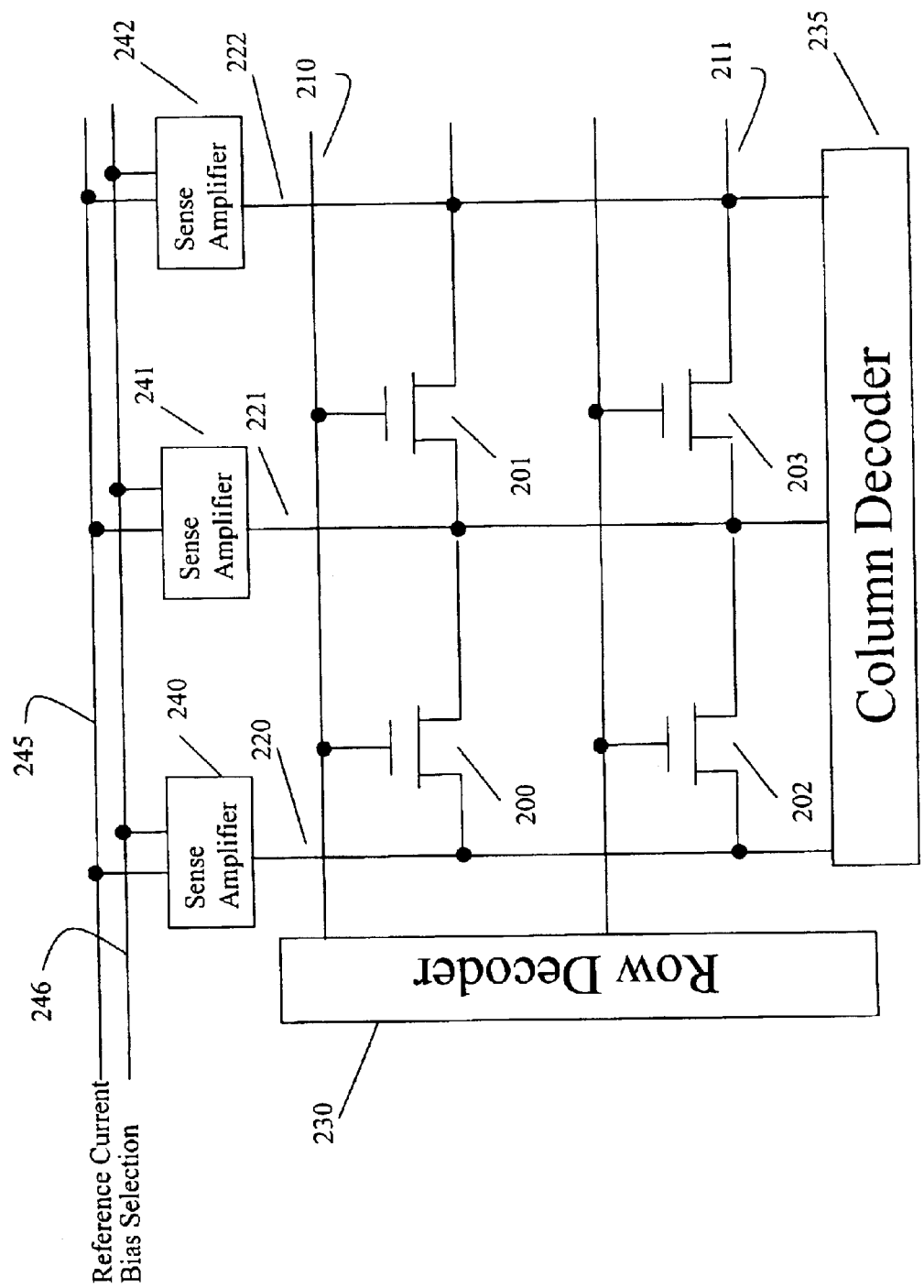
FIG. 15 is a schematic diagram illustrating another method of configuring the ferroelectric FETs in a memory array.
Figure 16:
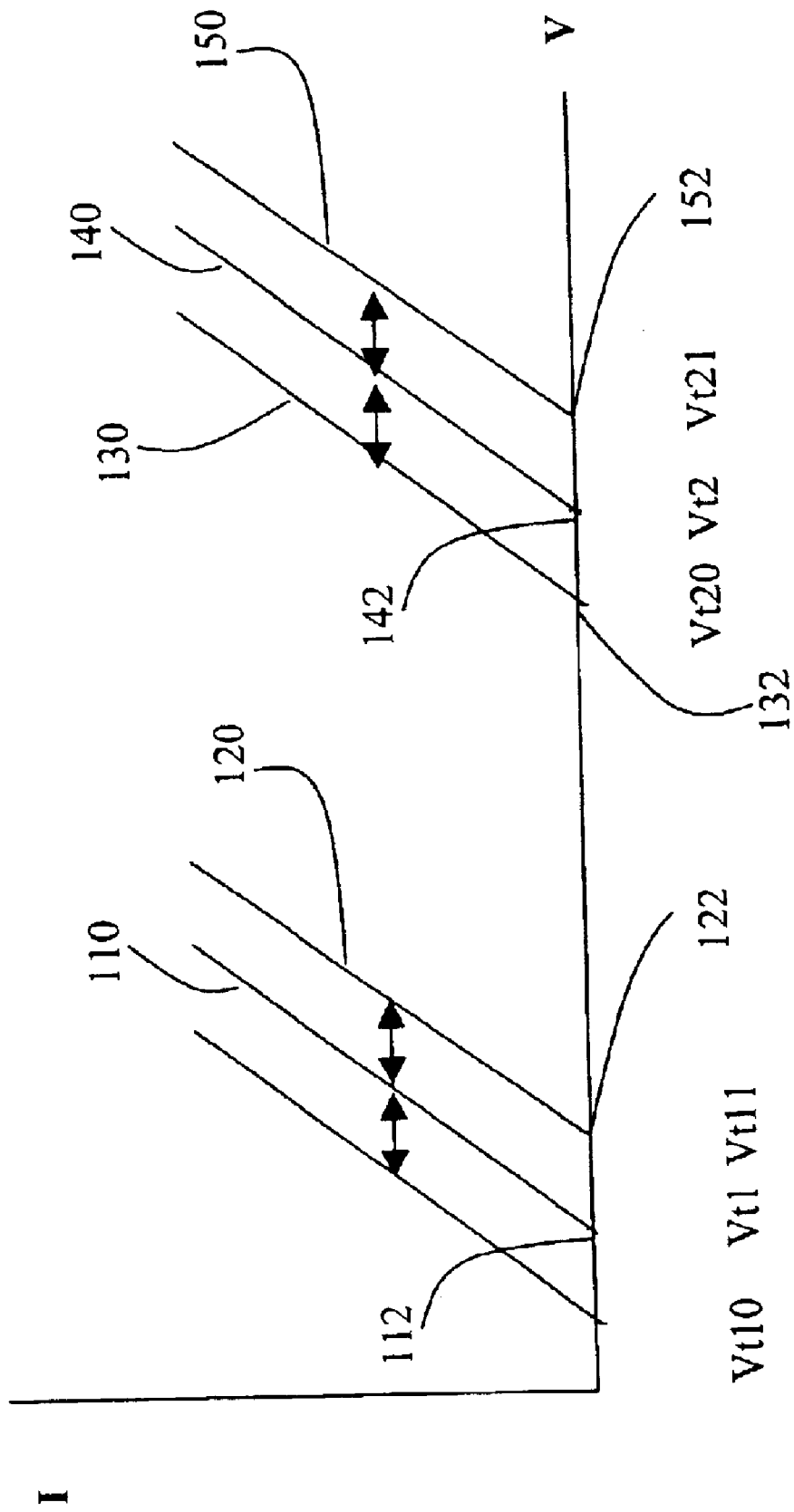
FIG. 16 is a graph illustrating I–V characteristics of a ferroelectric FET in another embodiment of this invention.

FIG. 15 illustrates another embodiment wherein a sense amplifier is utilized that has the capability of operating either at Vt1 or Vt2, and detecting a differential voltage about either Vt1 or Vt2. In one embodiment, this is accomplished by means of a bias selection signal 246v that has the effect of changing the operating point of the sense amplifier. When operating at Vt1, such a sense amplifier detects a negative shift about Vt1 (Vt10) or a positive shift about Vt1 (Vt11). When operating at Vt2, the sense amplifier detects a negative shift about Vt2 (Vt0) or a positive shift (Vt21). FIG. 16 is a graph illustrating the I–V characteristics of the ferroelectric transistor in the linear region with the corresponding threshold shifts in this embodiment of this invention.

During operation, the sense amplifier identifies the low ferro state by indicating a threshold shift of either Vt10 or Vt20. The sense amplifier identifies the high ferro state by indicating a threshold shift of either Vt11 or Vt21. The stored data state of the ferroelectric transistor is modified by applying voltages to change only the polarization of the transistor, as described in the previous embodiment. A given cell may or may not contain injected charge in the dielectric layers of the ferroelectric transistor during operation, effecting only whether the sense amplifier operates at a Vt1 or Vt2 operating voltage.

Figure 17:
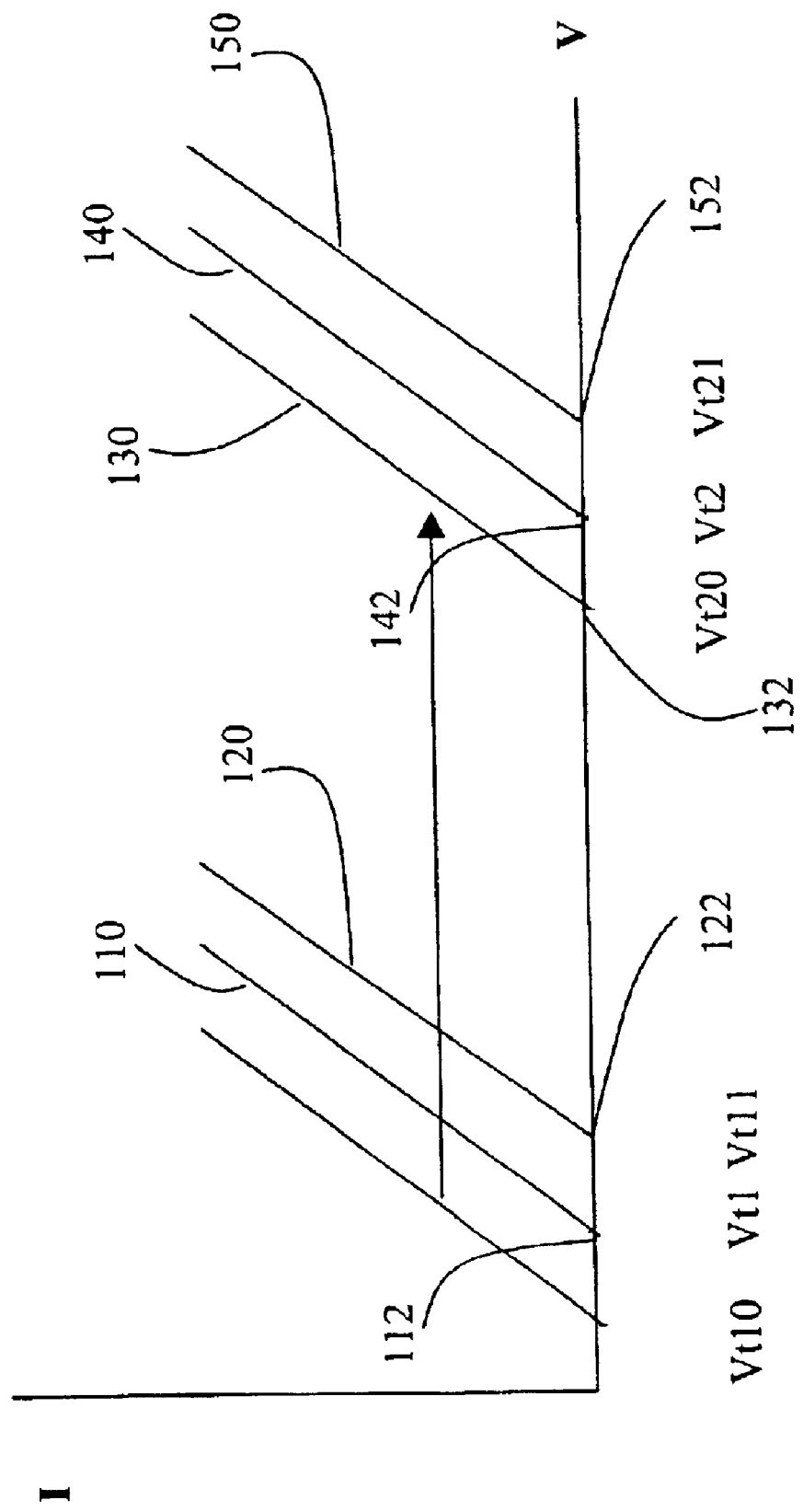
FIG. 17 is a graph illustrating the threshold shift when injecting negative charge when a low ferro state is detected upon power down.
Figure 18:
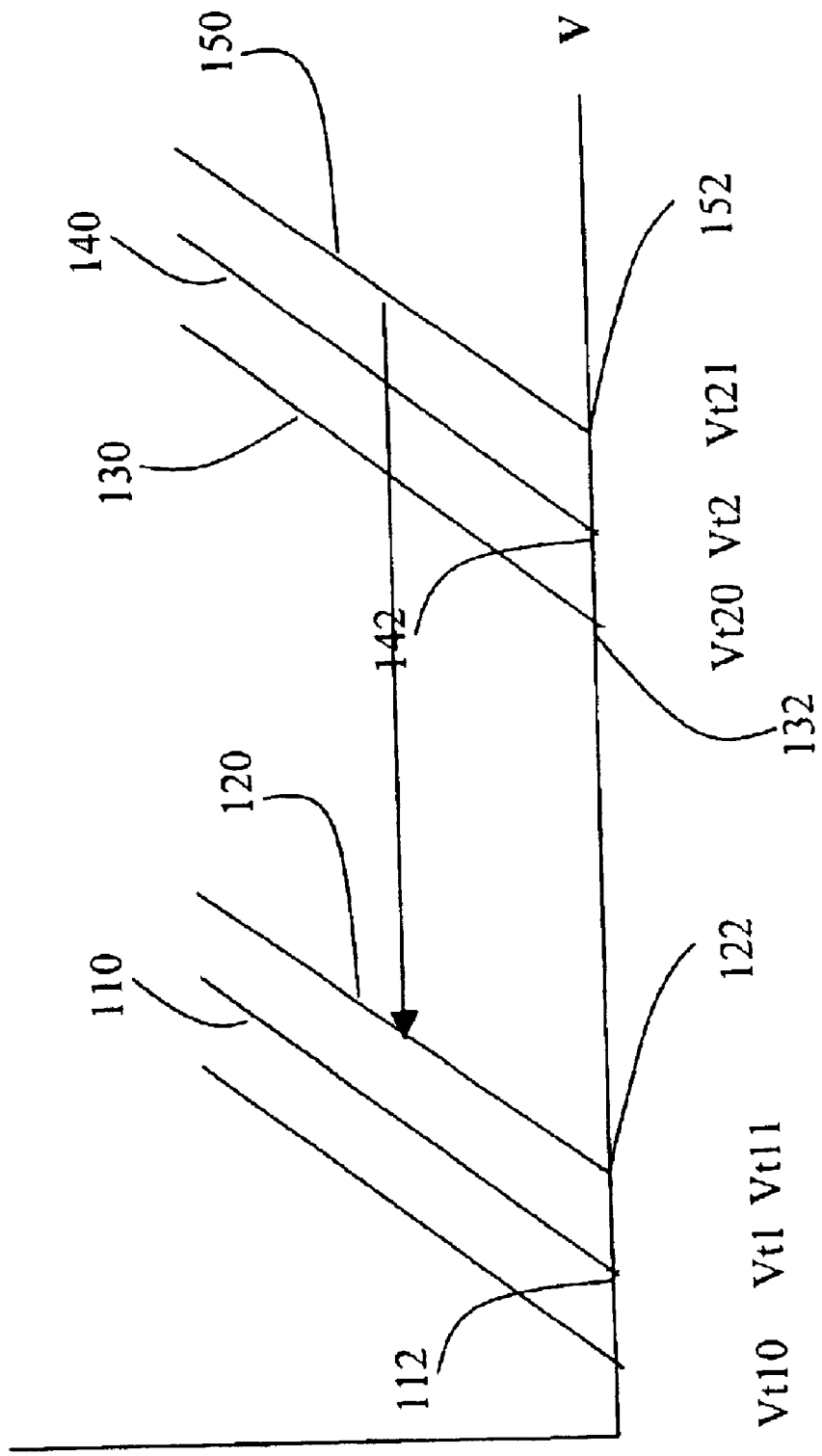
FIG. 18 is a graph illustrating the threshold shift when injecting negative charge when a high ferro state is detected upon power down.

On power down, the polarization state is measured and appropriate charge is injected into the dielectric layers of the ferroelectric transistor in order to extend the retention time. If a low ferro state is detected, corresponding to threshold voltages Vt10 or Vt20, then voltage biases are applied to the terminals of the ferroelectric FET to inject electrons into the ferroelectric transistor before the transistor is powered down. Since such biasing also polarizes the ferroelectric layer to a low ferro state. Adding the threshold effects of the injected negative charge and the polarization to the low ferro state, the resulting threshold is Vt20, as shown in FIG. 17. Similarly, if a high ferro state is detected before power down, corresponding to threshold voltages Vt11 or Vt21, then injected electrons must be removed from the ferroelectric transistor before the transistor is powered down. Since biasing to remove electron charge from the dielectric layers also polarizes the ferroelectric layer to a high ferro state, the final threshold voltage when negative charge is injected is Vt11, as shown in FIG. 18. On power up, the threshold of the ferroelectric device is either Vt20 or Vt11. The Vt20 threshold was stored in the ferroelectric transistor if a low ferro polarization state of the ferroelectric transistor was detected before power down. Since Vt20 already corresponds to a low ferro polarization state, a change of stored states is not needed. Since the polarization of the ferroelectric transistor may have relaxed during the powered down period, the turn-on threshold voltage might have drifted towards Vt2. In this case, a voltage bias can be applied to the ferroelectric transistor to restore the Vt20 level.

The Vt11 threshold was stored in the ferroelectric transistor if a high ferro polarization state of the ferroelectric transistor was detected before power down. Since Vt11 already corresponds to a high ferro polarization state, a change of stored states is not needed. Since the polarization of the ferroelectric transistor may have relaxed during the powered down period, the turn-on threshold voltage might have drifted towards Vt1. In this case, a voltage bias can be applied to the ferroelectric transistor to restore the Vt11 level.

Figure 19:
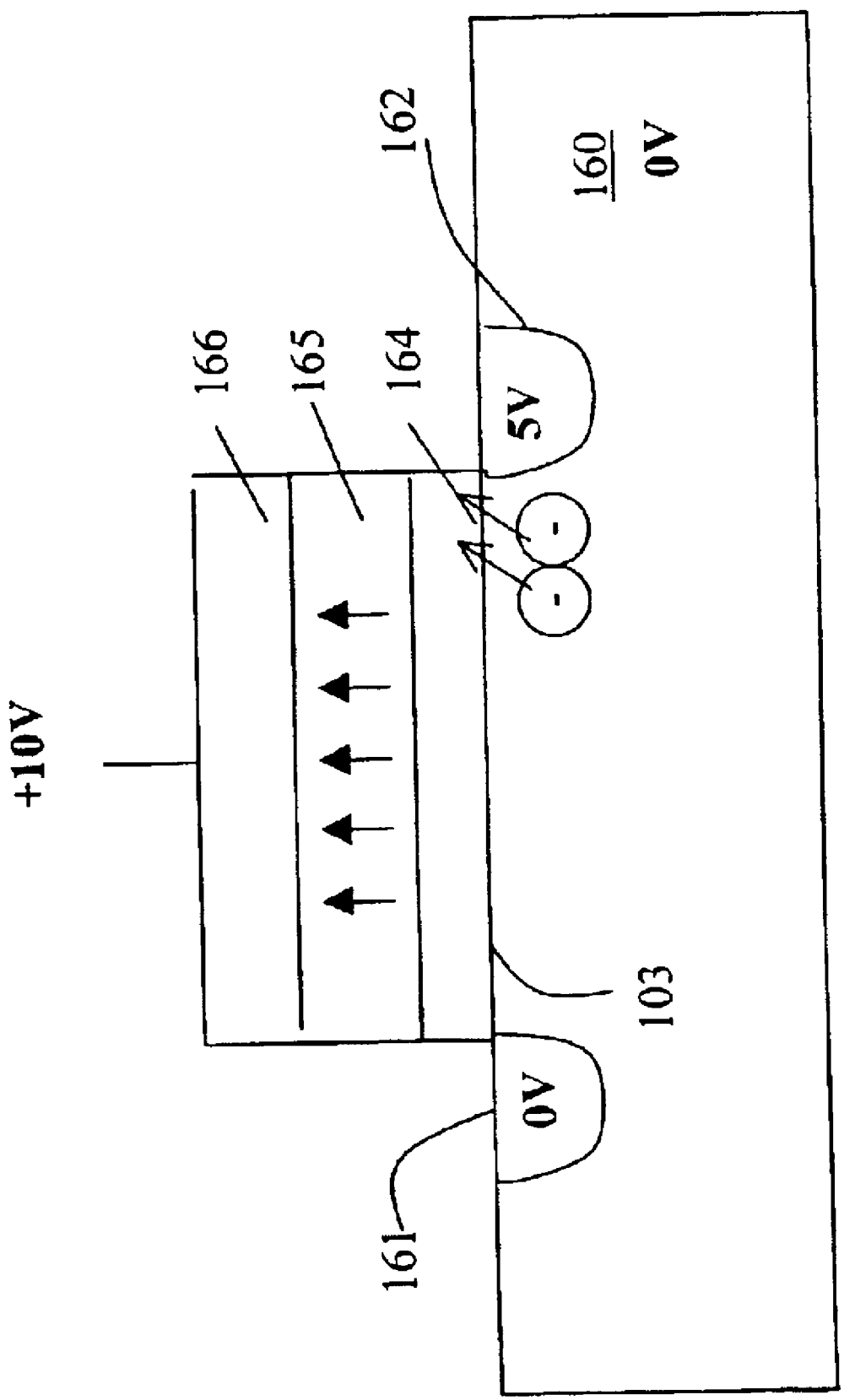
FIG. 19 is a cross sectional diagram that illustrates another embodiment of this invention wherein the charge is injected into the dielectric buffer layer or the ferroelectric layer in the area of the drain.

FIG. 19 is a cross sectional diagram that illustrates another embodiment of this invention wherein the negative charge is injected into the dielectric buffer layer 164 or the ferroelectric layer 165 in the area of the drain (162). Charge injection mechanisms include hot carrier injection, avalanche breakdown, and impact ionization. When charge is injected in the drain area 162, the turn on threshold voltage of the ferroelectric device is not altered due to that charge. However, when electrons are injected into the dielectric layers in the area of the source 161, the turn-on threshold of the ferroelectric transistor is increased. This principle is utilized in this embodiment, operating the ferroelectric transistor of FIG. 19 with source 161 and drain 162 when detecting the polarization stored in the ferroelectric transistor or when injecting negative charge in the drain region 162 for extended retention, but reversing the role of source and drain (i.e. source 162 and drain 161) when detecting the negative charge that was injected. Since the threshold shift due to the negative charge injected can be determined independently of the threshold shift due to the polarization, the threshold shifts induced due to the negative charge injection can overlap the threshold voltages induced due to the polarization of the ferroelectric material.

Figure 20:
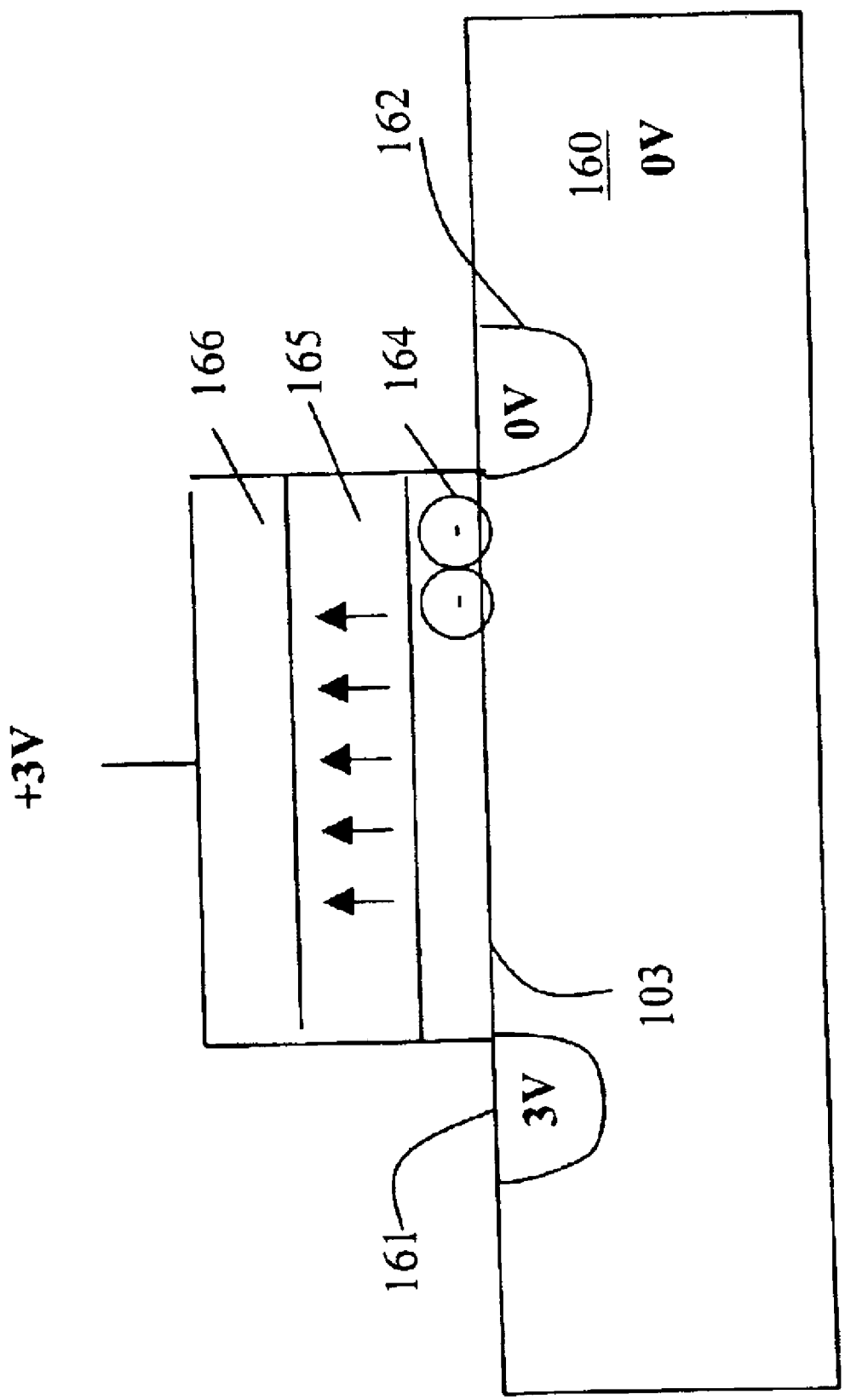
FIG. 20 illustrates the biasing of the ferroelectric FET when sensing the charge injection in the embodiment of FIG. 16.

FIG. 20 illustrates the biasing of the ferroelectric FET when sensing the negative charge injection. This operation is performed when the ferroelectric FET is first powered up. The ferroelectric FET is operated reversing the role of source and drain when compared to the biasing during the injection. For the purposes of illustration, N+ region 162 is at ground potential while N+ region 161 is at +3V. With this bias, the negative charge in the dielectric layer 164 in the region of N+ region 162 is significant in determining the turn-on threshold of the ferroelectric FET. For the purposes of illustration, the turn-on threshold voltage when no negative charge is injected is Vt1, corresponding to a "low charge state" and when negative charge is injected is Vth, the "high charge state".

When the injected negative charge has been determined at power-up biasing is applied to remove the injected negative charge from the drain and the roles of source and drain are reversed. If a "high charge state" is detected, voltages are then applied to polarize the ferroelectric layer 165 of that device to the high ferro state. If a "low charge state" is detected, voltages are then applied to polarize the ferroelectric layer 165 of that device to the low ferro state.

Figure 21:
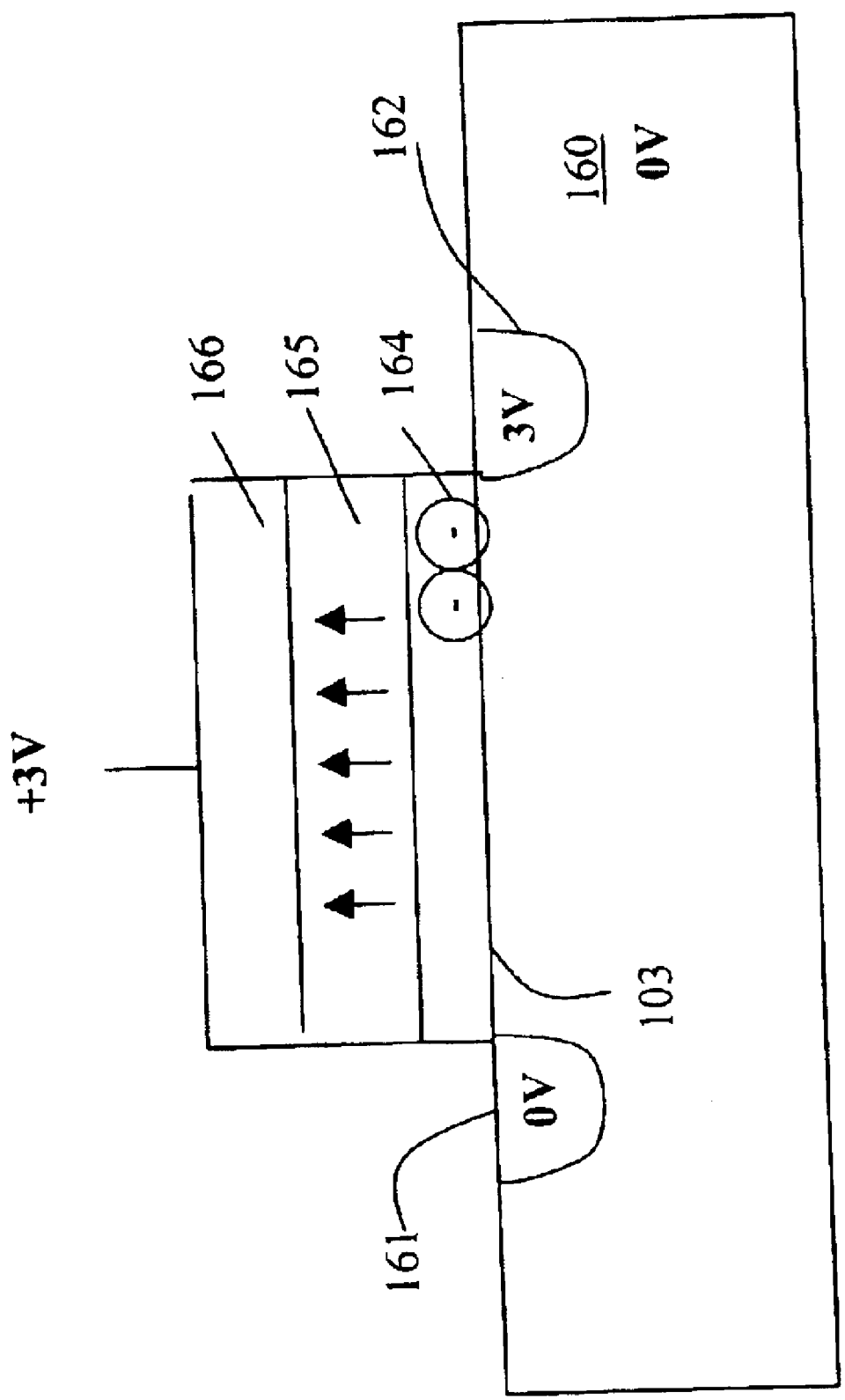
FIG. 21 illustrates the biasing of the ferroelectric FET when sensing the polarization of the ferroelectric FET in the embodiment of FIG. 16.

FIG. 21 illustrates the biasing of the ferroelectric FET when sensing the polarization of the ferroelectric FET. The lower of the voltages on N-type regions 161 and 162 is applied to the side of the transistor into which the negative charge is not injected, i.e. the side of the transistor taking the role of the source. The higher of the voltages is applied to the side of the transistor into which the negative charge is injected, i.e. the side of the transistor taking the role of the drain.

On power-down, the ferroelectric state is detected. If a high ferro polarization state is detected, voltages are applied to inject negative charge to result in a high charge state in the ferroelectric FET. If a low ferro polarization state is detected, no further action is taken since all negative charge is removed during the power-up of the ferroelectric FET.

In a variation of this embodiment, the negative charge is not removed during power-up. Instead the negative charge is removed during the power-down cycle. This negative charge can be removed at the beginning of the power-down sequence, before the ferroelectric polarization state is detected. Alternatively the negative charge can be removed as necessary after the ferroelectric polarization state has been detected. Specifically, if a low ferro polarization is detected during the power-down sequence, voltages are applied to remove any injected negative charge.

The foregoing description is only illustrative of the invention. Various alternatives and modifications can be devised by those skilled in the art without departing from the invention. In particular, though reference to a ferroelectric FET formed on a P-type silicon substrate and N-type source and drain regions has been made, the ferroelectric FET can also be formed on N-type substrate with P-type source and drain regions. Though mention is made of a single dielectric buffer layer, this layer could be composed of multiple layers without departing from the invention. Though specific charge injection mechanisms such as tunneling, avalanching, and impact ionization are described in the foregoing description, any mechanism that injects negative or positive charges into any layer within the ferroelectric FET structure can be utilized without departing from the present invention. Accordingly, the present invention embraces all such alternatives, modifications, and variances that fall within the scope of the appended claims.

What is claimed is:

1. A ferroelectric field effect transistor (FET) exhibiting hysteresis, comprising:
    a semiconductor substrate of a first conductivity type;
    a source, said source comprising a region of said semiconductor substrate doped to have a conductivity opposite that of said semiconductor substrate;
    a drain, spaced from said source, said drain comprising a portion of said semiconductor substrate doped to have a conductivity opposite of said substrate,
    a channel being formed in the space between said source and said drain;
    a ferroelectric layer overlaying the channel;
    a conductive electrode layer overlaying the ferroelectric layer;
    wherein charge is injected into and removed from the ferroelectric layer, the quantity of charge so stored being selected so as to provide the ferroelectric FET with a first threshold voltage and a first shifted threshold voltage when charge is stored and a second threshold voltage and a second shifted threshold voltage when charge is removed.

2. The FET of claim 1 wherein charge is injected into the ferroelectric FET to produce a first threshold voltage when a first polarization state is determined before power is removed.

3. The FET of claim 1 wherein charge is removed from the ferroelectric FET to produce a second threshold voltage when a second polarization state is determined before power is removed.

4. The FET of claim 1 further comprising a dielectric layer formed between said ferroelectric layer and conductive electrode layer.

5. The FET of claim 1 further comprising a dielectric layer formed between said channel and said ferroelectric layer.

6. The FET of claim 5 wherein charge is injected into the first dielectric layer.

7. The FET of claim 5 wherein the dielectric layer comprises silicon nitride.

8. The FET of claim 5 wherein the dielectric layer comprises silicon dioxide.

9. The FET of claim 5 wherein the dielectric layer comprises thermally grown silicon dioxide.

10. The FET of claim 5 wherein the dielectric layer comprises two or more dielectric sub-layers.

11. The FET of claim 5 wherein the dielectric layer comprises a silicon nitride layer overlying a silicon dioxide layer.

12. The FET of claim 1 wherein the conductive electrode layer comprises a polysilicon-containing material.

13. The FET of claim 1 wherein the ferroelectric layer comprises a material having the general formula $A_xMn_yO_z$, where x, y, z vary from 0.1 to 10 and A is a rare earth selected from a group consisting of CE, Pr, Nd, Pm, Sm, Eu, GD, Tb, Dy, Ho, Er, Tm, Yb, Lu, Y or Sc.

14. The FET of claim 1 wherein the ferroelectric layer comprises a low-dielectric ferroelectric material.

15. The FET of claim 1 wherein the ferroelectric layer is formed utilizing MOCVD.

16. The FET of claim 4 wherein the dielectric layer is formed utilizing either ALD and MOCVD.

17. The FET of claim 5 wherein the dielectric layer is formed utilizing either ALD or MOCVD.

18. The FET of claim 4 wherein the dielectric layer comprises a material with a dielectric constant of 10 and greater.

19. The FET of claim 5 wherein the dielectric layer comprises a material with a dielectric constant of 10 and greater.

20. The FET of claim 1 wherein charge is injected utilizing mechanisms selected from a group consisting of tunneling, Fowler-Nordheim tunneling, hot carrier injection, avalanche breakdown, and impact ionization.

21. The FET of claim 1 wherein the silicon substrate comprises a CMOS compatible substrate.

22. The FET of claim 1 wherein the silicon substrate comprises a silicon-on-insulator substrate.

* * * * *

UNITED STATES PATENT AND TRADEMARK OFFICE
CERTIFICATE OF CORRECTION

PATENT NO. : 6,825,517 B2
DATED : November 30, 2004
INVENTOR(S) : Klaus Dimmler and Alfred P. Gnadinger It is certified that error appears in the above-identified patent and that said Letters Patent is hereby corrected as shown below:

Column 1,
Line 4, above the "FIELD OF THE INVENTION" should read:
-- STATEMENT REGARDING FEDERALLY SPONSORED RESEARCH OR DEVELOPMENT
This invention was made with Government support under contract DASG60-01-C-0046 awarded by the U.S. Army Space and Missile Defense Command. The Government has certain rights to this invention. --

Signed and Sealed this

Fifteenth Day of February, 2005

JON W. DUDAS
*Director of the United States Patent and Trademark Office*